(12) United States Patent
Bolotnikov et al.

(10) Patent No.: US 10,199,465 B2
(45) Date of Patent: Feb. 5, 2019

(54) CELLULAR LAYOUT FOR SEMICONDUCTOR DEVICES

(71) Applicant: General Electric Company, Schenectady, NY (US)

(72) Inventors: Alexander Viktorovich Bolotnikov, Niskayuna, NY (US); Peter Almern Losee, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 342 days.

(21) Appl. No.: 14/313,820

(22) Filed: Jun. 24, 2014

(65) Prior Publication Data
US 2015/0372089 A1     Dec. 24, 2015

(51) Int. Cl.
*H01L 29/76*     (2006.01)
*H01L 29/10*     (2006.01)
(Continued)

(52) U.S. Cl.
CPC ...... *H01L 29/1095* (2013.01); *H01L 29/0696* (2013.01); *H01L 29/0869* (2013.01);
(Continued)

(58) Field of Classification Search
CPC ............. H01L 29/0696; H01L 29/1095; H01L 27/088; H01L 27/098; H01L 29/1608;
(Continued)

(56) References Cited

U.S. PATENT DOCUMENTS

| 5,844,277 | A |   | 12/1998 | Hshieh et al. |
| 5,981,343 | A | * | 11/1999 | Magri ................ H01L 29/0696 |
|           |   |   |         |                          257/E21.383 |

(Continued)

FOREIGN PATENT DOCUMENTS

| DE | 3114971   A1 | 1/1982 |
| DE | 3628309   A1 | 2/1987 |
| JP | 2009076762 A | 4/2009 |

OTHER PUBLICATIONS

GB Combined Search and Examination Report dated Jan. 5, 2016 in connection to related GB application 1511043.0.

(Continued)

*Primary Examiner* — Shouxiang Hu
(74) *Attorney, Agent, or Firm* — GE Global Patent Operation; John P. Darling

(57) ABSTRACT

A method of fabricating a semiconductor device cell at a surface of a silicon carbide (SiC) semiconductor layer includes forming a segmented source and body contact (SSBC) of the semiconductor device cell over the surface of the SiC semiconductor layer. The SSBC includes a body contact portion disposed over the surface of the semiconductor layer and proximate to a body contact region of the semiconductor device cell, wherein the body contact portion is not disposed over the center of the semiconductor device cell. The SSBC also includes a source contact portion disposed over the surface of the semiconductor layer and proximate to a source contact region of the semiconductor device cell, wherein the at least one source contact portion only partially surrounds the body contact portion of the SSBC.

17 Claims, 18 Drawing Sheets

(51) Int. Cl.
    *H01L 29/08*         (2006.01)
    *H01L 29/16*         (2006.01)
    *H01L 29/66*         (2006.01)
    *H01L 29/417*       (2006.01)
    *H01L 29/78*         (2006.01)
    *H01L 29/739*       (2006.01)
    *H01L 29/06*         (2006.01)

(52) U.S. Cl.
    CPC ...... *H01L 29/0878* (2013.01); *H01L 29/1608* (2013.01); *H01L 29/41741* (2013.01); *H01L 29/66068* (2013.01); *H01L 29/66712* (2013.01); *H01L 29/7395* (2013.01); *H01L 29/7802* (2013.01); *H01L 29/7835* (2013.01)

(58) Field of Classification Search
    CPC ........... H01L 29/0869; H01L 29/66068; H01L 29/7802; H01L 29/66712; H01L 29/7835; H01L 29/41741; H01L 29/0692; H01L 29/7827
    USPC .................. 257/341, 329, 335, 328, 342, 77
    See application file for complete search history.

(56) References Cited

U.S. PATENT DOCUMENTS

| | | | |
|---|---|---|---|
| 6,376,878 B1 * | 4/2002 | Kocon | H01L 29/0634 257/288 |
| 6,566,710 B1 | 5/2003 | Strachan | |
| 6,894,345 B2 | 5/2005 | Boden, Jr. | |
| 7,075,149 B2 | 7/2006 | Sato et al. | |
| 7,498,633 B2 | 3/2009 | Cooper et al. | |
| 7,547,585 B2 | 6/2009 | Boden | |
| 7,683,425 B2 | 3/2010 | Pang | |
| 8,178,922 B2 | 5/2012 | Hsieh | |
| 8,362,549 B2 | 1/2013 | Ikura | |
| 8,394,680 B2 | 3/2013 | Lee | |
| 9,029,945 B2 * | 5/2015 | Ryu | H01L 29/0696 257/341 |
| 2004/0217418 A1 | 11/2004 | Imam | |
| 2006/0043488 A1 * | 3/2006 | Husher | G05B 13/048 257/355 |
| 2007/0278568 A1 | 12/2007 | Williams et al. | |
| 2007/0278571 A1 * | 12/2007 | Bhalla | H01L 29/0847 257/341 |
| 2009/0072304 A1 | 3/2009 | Adan | |
| 2010/0001291 A1 | 1/2010 | Otremba et al. | |
| 2010/0176446 A1 | 7/2010 | Hsieh | |
| 2011/0006362 A1 | 1/2011 | Hsieh | |

OTHER PUBLICATIONS

GB Combined Search and Examination Report dated on Dec. 9, 2015 in connection to corresponding GB application 1510259.3.
Hu et al. "Optimum design of power MOSFET's", Electron Devices, IEEE Transactions on, IEEE, Dec. 1984, pp. 1693-1700,vol. 31; Issue: 12.
U.S. Appl. No. 14/313,785, filed Jun. 24, 2014, Bolotnikov.
Examination Report issued in connection with corresponding GB Application No. 1510259.3 dated Jul. 21, 2016.
Examination Report issued in connection with corresponding GB Application No. 1510259.3 dated Dec. 5, 2016.
Preliminary Search Report and Written Opinion issued in connection with corresponding FR Application No. 1555622 dated Feb. 28, 2018.

* cited by examiner

CELLULAR LAYOUT FOR SEMICONDUCTOR DEVICES

BACKGROUND

The subject matter disclosed herein relates to semiconductor devices, such as silicon carbide (SiC) power devices, including field transistors (e.g., MOSFET, DMOSFET, UMOSFET, VMOSFET, etc.), insulated gate bipolar transistors (IGBT), insulated base MOS-controlled thyristors (IBMCT), junction field effect transistors (JFET), and metal-semiconductor field effect transistors (MESFET).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), junction gate field-effect transistor (JFETs), insulated gate bipolar transistors (IGBTs), and other suitable transistors).

Specifically for high-frequency, high-voltage and/or high-current applications, devices utilizing wide bandgap semiconductors, such as silicon carbide (SiC), aluminum nitride (AlN), gallium nitride (GaN), etc., may afford a number of advantages in terms of high temperature operation, reduced ON-resistance, and smaller die size than corresponding silicon (Si) devices. Accordingly, wide-bandgap semiconductor devices offer advantages to power conversion applications including, for example, power distribution systems (e.g., in electrical grids), power generation systems (e.g., in solar and wind converters), as well as consumer goods (e.g., electric vehicles, appliances, power supplies, etc.).

BRIEF DESCRIPTION

In an embodiment, a system includes a semiconductor device cell disposed at a surface of a silicon carbide (SiC) semiconductor layer. The semiconductor device cell includes: a drift region having a first conductivity type, a well region having a second conductivity type disposed adjacent to the drift region, a source region having the first conductivity type disposed adjacent to the well region, a channel region having the second conductivity type disposed adjacent to the source region and proximal to the surface, and a body contact region having the second conductivity type disposed over a portion of the well region, wherein the body contact region is not centered within of the semiconductor device cell. The device cell includes a segmented source and body contact (SSBC) disposed over a portion of the surface, wherein the SSBC includes: a body contact portion disposed over the body contact region, and a source contact portion disposed adjacent to the body contact region and over a portion of the source region, wherein the source contact portion does not completely surround the body contact portion of the SSBC.

In an embodiment, a system includes a cellular semiconductor device layout having a plurality of semiconductor device cells disposed at a surface of a silicon carbide (SiC) semiconductor layer. The plurality of cellular semiconductor device cells each include: a drift region having a first conductivity type, a well region having a second conductivity type disposed adjacent to the drift region, a source region having the first conductivity type that is disposed adjacent to the well region. The well region of each device cell includes a body contact region disposed proximal to the surface, and the source region of each device cell includes a source contact region disposed proximal to the surface and proximal to the body contact region. The plurality of cellular semiconductor device cells each include an asymmetric segmented source and body contact (SSBC) disposed over a portion of the surface, wherein the asymmetric SSBC includes a body contact portion disposed over the body contact region of the semiconductor device cell and a source contact portion disposed adjacent to the body contact portion and over the source contact region of the semiconductor device cell, wherein the source contact portion of the asymmetric SSBC does not completely surround the body contact portion of the asymmetric SSBC.

In an embodiment, a method of fabricating a semiconductor device cell at a surface of a silicon carbide (SiC) semiconductor layer includes forming a segmented source and body contact (SSBC) of the semiconductor device cell over the surface of the SiC semiconductor layer. The SSBC includes a body contact portion disposed over the surface of the semiconductor layer and proximate to a body contact region of the semiconductor device cell, wherein the body contact portion is not aligned with the center of the semiconductor device cell. The SSBC also includes a source contact portion disposed over the surface of the semiconductor layer and proximate to a source contact region of the semiconductor device cell, wherein the at least one source contact portion only partially surrounds the body contact portion of the SSBC.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
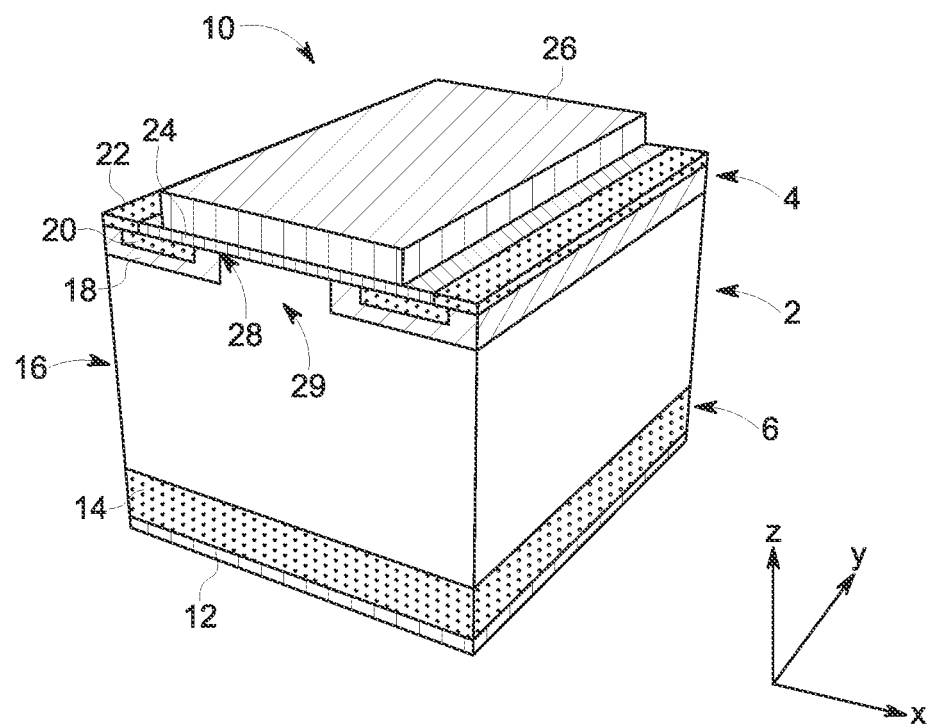
FIG. 1 is a schematic of a typical planar MOSFET device.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. The term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art. The term "symmetric" or "symmetrical" may be used herein to describe a segmented source/body contact region, a segmented source/body contact, or a device cell that has at least two mirror planes of symmetry positioned perpendicular to the plane of the semiconductor surface. The term "asymmetric" or "asymmetrical" may be used herein to describe a segmented source/body contact region, a segmented source/body contact, or a device cell that has less than two mirror planes of symmetry positioned perpendicular to the plane of the semiconductor surface. The term "centered" may be used herein to describe a segmented source/body contact region, a segmented source/body contact, or a device cell in which the body contact region is disposed substantially in the center of the segmented source/body contact region, segmented source/body contact, or device cell, respectively. The term "off-centered" or the phrase "not centered" may be used herein to describe a segmented source/body contact region, a segmented source/body contact, or a device cell in which the body contact region is not disposed substantially in the center of the segmented source/body contact region, segmented source/body contact, or device cell, respectively. Additionally, a semiconductor device cell described herein as being disposed or fabricated "at the surface" of a semiconductor layer is intended to include a semiconductor device cell having portions disposed within the bulk of the semiconductor layer, portions disposed proximate to the surface of the semiconducting layer, portions disposed even with the surface of the semiconductor layer, and/or portions disposed above or on top the surface of the semiconductor layer.

One of the essential building blocks of modern power electronics is the field-effect transistor (FET) device. For example, FIG. 1 illustrates an active cell of a planar n-channel field-effect transistor, namely a DMOSFET, hereinafter MOSFET device 10. It may be appreciated that, in order to more clearly illustrate certain components of the MOSFET device 10, as well as other devices discussed below, certain commonly understood design elements (e.g., top metallization, passivation, edge termination, and so forth) may be omitted. The illustrated MOSFET device 10 of FIG. 1 includes a semiconductor layer 2 (e.g., a silicon carbide semiconductor layer) having a first surface 4 and a second surface 6. The semiconductor layer 2 includes a drift region 16 having a first conductivity type (e.g., an n-type drift layer 16), a well region 18 adjacent to the drift region and proximal to the first surface, the well region having a second conductivity type (e.g., a p-well 18). The semiconductor layer 2 also includes a source region 20 that is adjacent to the well region 18, the source region having the first conductivity type (e.g., n-type source region 20). A gate insulating layer 24 is disposed on a portion of the first surface 4 of the semiconductor layer 2, and a gate electrode 26 is disposed on the gate insulating layer 24. The second surface 6 of the semiconductor layer 2 is a substrate layer 14, and the drain contact 12 is disposed on the bottom of device 10 along the substrate layer 14. Source/body contact 22 is disposed on top of the semiconductor layer 2, partially covering source region 20 and well/body regions 18. During operation, an appropriate gate voltage (e.g., at or beyond a threshold voltage ($V_{TH}$) of the MOSFET device 10) may cause an inversion layer to be formed in the channel region 28, as well as a conductive path to be enhanced in the junction field-effect transistor (JFET) region 29 due to accumulation of carriers, allowing current to flow between the contact 22 (i.e., the source electrode) and the drain contact 12. It should be appreciated that, for the MOSFET devices discussed herein, the channel region 28 may be generally defined as an upper portion of the p-well region 18 disposed below the gate electrode 26 and gate dielectric 24.

Figure 2:
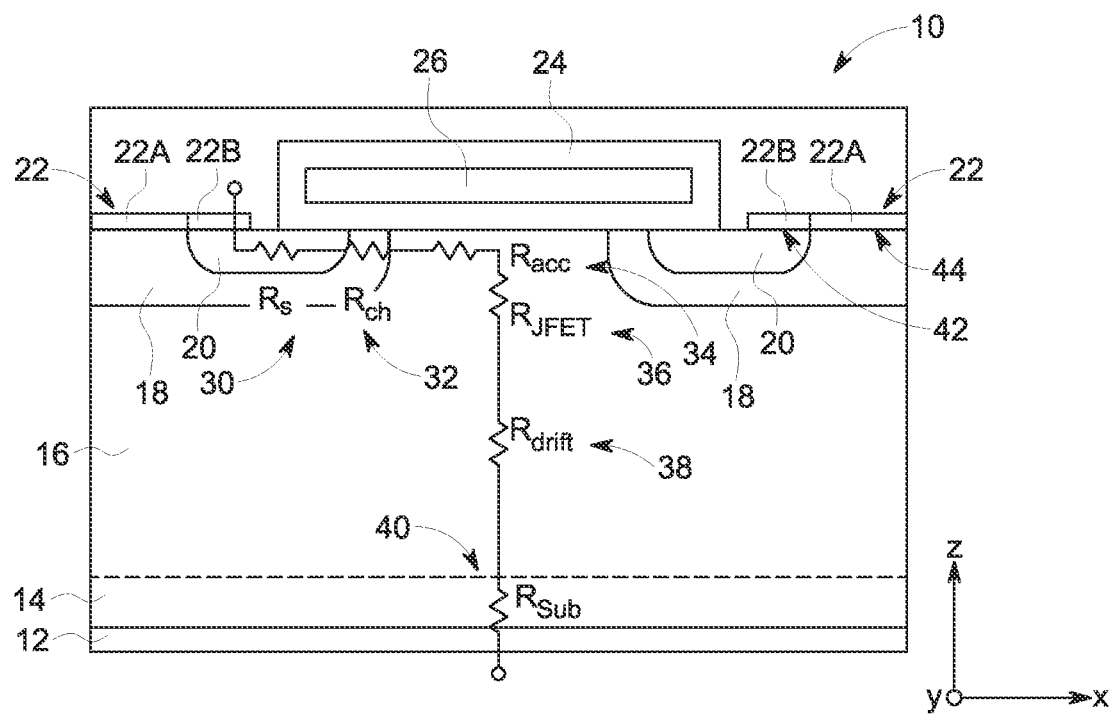
FIG. 2 is a schematic illustrating resistances for various regions of a typical MOSFET device.

As illustrated in FIG. 2, the various regions of the MOSFET device 10 may each have an associated resistance, and a total resistance (e.g., an on-state resistance, $R_{ds}(on)$) of the MOSFET device 10, which may be represented as a sum of each of these resistances. For example, as illustrated in FIG. 2, on-state resistance, $R_{ds}(on)$, of the n-channel MOSFET device 10 may be approximated as a sum of: a resistance $R_s$ 30 (e.g., a resistance of n+ region 20 and a resistance of the contact 22); a resistance $R_{ch}$ 32 (e.g., an inversion channel resistance of the region 28 illustrated in FIG. 1); a resistance $R_{acc}$ 34 (e.g., a resistance of an accumulation layer between the gate oxide 24 and portion of drift layer 16 located between p-well regions 18); a resistance $R_{JFET}$ 36 (e.g., resistance of undepleted neck region between p-well regions 18); a resistance $R_{drift}$ 38 (e.g., the resistance about the drift layer 16); and a resistance $R_{sub}$ 40 (e.g., the resistance about the substrate layer 14). Note that the resistances illustrated in FIG. 2 are not intended to be exhaustive, and that other resistances (e.g., drain contact resistance, spreading resistance, etc.) could potentially be present within the semiconductor device 10.

With the foregoing in mind, present embodiments are directed toward cellular device designs and layouts that enable improved semiconductor device performance. In particular, to reduce or minimize device on-state conduction losses (e.g., minimize $R_{ds}(on)$) it may be desirable to reduce resistance of the components of the MOSFET device 10. In certain cases, one or two resistance components may dominate conduction losses, and addressing these factors can significantly impact $R_{ds}(on)$. For example, for devices in which the drift resistance 38, the substrate resistance 40 and the contact resistance 30 are negligible, such as low-voltage devices or devices suffering from low inversion layer mobility (e.g. SiC devices), the channel resistance ($R_{ch}$ 32) may account for a significant portion of device conduction losses. Accordingly, present embodiments include cellular device designs and layouts that provide increased channel width and/or increased channel density to reduce the channel resistance ($R_{ch}$ 32) and, thereby, reduce on-state conduction losses. By further example, in medium- and high-voltage devices, JFET region resistance ($R_{JFET}$ 36) may account for a significant portion of total conduction losses. Accordingly, present embodiments include device designs and layouts with increased JFET density to reduce the JFET region resistance ($R_{JFET}$) and, thereby, reduce conduction losses for medium- and high-voltage devices, as well as for low-voltage devices operating at higher temperatures. Additionally, it may be appreciated that the presently disclosed cellular device designs and layouts may additionally enable reduction of a spreading resistant component, affording further improvement to device performance. Furthermore, while the present approach may be discussed below in the context of SiC MOSFET devices, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable semiconductor) as well as other types of device structures (e.g., UMOSFET, VMOSFETs, insulated gate bipolar transistors (IGBT), insulated base MOS-controlled thyristors (IBMCT), junction field effect transistors (JFET), and metal-semiconductor field effect transistor (MESFET), or any other suitable device) utilizing both n- and p-channel designs.

As illustrated in FIG. 2, the contacts 22 of the MOSFET device 10, which generally provide an ohmic connection to the source electrode, are disposed over both a portion of the n+ region 20 and a portion of the p-well region or p+ body region 18. The contact 22 is generally a metallic interface comprising one or more metal layers situated between these semiconductor portions of the MOSFET device 10 and the metallic source electrode. In particular, the portion of the n+ region 20 of the MOSFET device 10 disposed below the contact 22 may be referred to herein as a source contact region 42 of the MOSFET device 10. Further, the portion of the p-well region or p+ body region 18 of the MOSFET device 10 that is disposed below the contact 22, which can be p+ doped at a higher level than the remainder of the p-well region 18, may be referred to herein as a body contact region 44 of the MOSFET device 10. For consistency, portions of the contact 22 may be designated herein based on the portion of the semiconductor device that is disposed below the contact 22. For example, the portion of the contact 22 disposed above a body contact region 44 may be referred to herein as the body contact portion 22A of the contact 22. Similarly, the portion of the contact 22 disposed above a source contact region 42 of the MOSFET device 10 may be referred to herein as a source contact portion 22B of the contact 22.

Figure 3A:
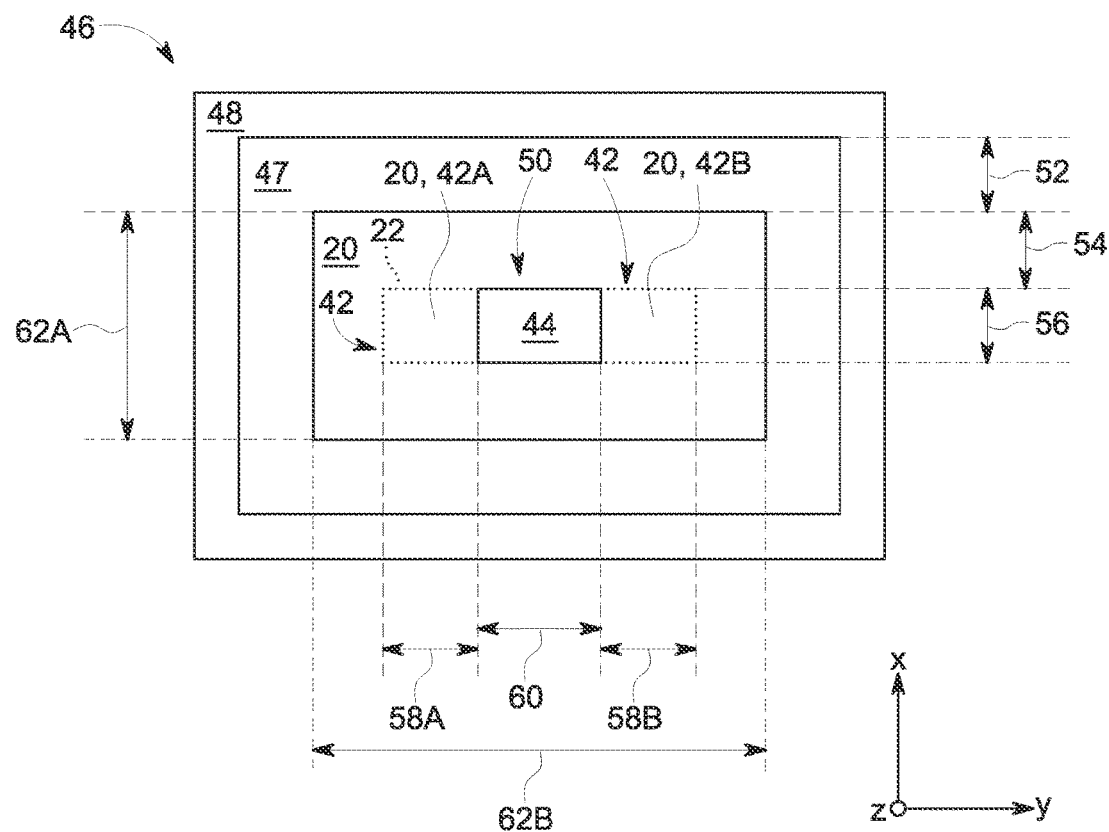
FIG. 3A is a top-down view of a semiconductor device cell having a symmetrical segmented source and body contact (SSBC) region, in accordance with embodiments of the present approach.

With the foregoing in mind, FIG. 3A is a top-down or plan view of an embodiment of a rectangular semiconductor device cell 46 (e.g., a MOSFET semiconductor device cell 46) that may enable reduced on-state conduction losses as set forth above. It may be appreciated that, for FIG. 3A, the eventual position of the contact 22 of the device cell 46 is illustrated as an outline (i.e., dotted rectangle 22) in order to demonstrate the layers of the device cell 46 that will be disposed below the contact 22. For example, the illustrated device cell 46 includes a rectangular body contact region 44 disposed in the middle of the device cell 46. The body contact region 44 of the device cell 42 is surrounded by an n+ region 20, which is, in turn, surrounded by an n-channel region 47 of the semiconductor device cell 46. Additionally, the illustrated semiconductor device cell 46 includes a junction field-effect transistor (JFET) region 48 that surrounds the p-channel region 47 of the device cell 46.

It may be appreciated that, as illustrated in FIG. 3A, portions of the n+ region 20 disposed below the contact 22 serve as portions 42A and 42B of the source contact region 42 of the device cell 46. As such, the area of the device cell 46 disposed under the contact 22 (i.e., the body contact region 44 along with both portions 42A and 42B of the source contact region 42) may be generally referred to herein as a segmented source and body contact (SSBC) region 50. Similarly, the contact 22, once formed, may be generally referred to herein as a segmented source and body contact (SSBC) 22. In the SSBC region 50 of the semiconductor device 46 illustrated in FIG. 3A, it should be noted that the body contact region 44 is only partially (i.e., not completely) surrounded by the portions 42A and 42B of the source contact region 42. In other words, in certain embodiments, the source contact region 42 (e.g., portions 42A and 42B of the source contact region 42) may be described as being disposed along less than all sides (e.g., edges, faces) of the body contact region 44. For example, in certain embodiments, portions of the source contact region 42 may be described as being positioned along less than six sides, less than five sides, less than four sides, less than three sides, less than two sides, or only one side of a body contact region 44; or the source contact may be described as being disposed along less than entire perimeter of the body contact region. Additionally, the illustrated device cell 46 may be described as having portions 42A and 42B of source contact region 42 disposed on opposite sides of the body contact region 44. Thus, the presently disclosed SSBC design minimizes cell size and increases density of conducting regions (e.g., channel, JFET, spreading) per unit cell.

It may be appreciated that, for the embodiment illustrated in FIG. 3A, the semiconductor device cell 46, the SSBC region 50, and/or the SSBC 22 may be described as being centered and/or symmetrical. For example, the device cell 46, the SSBC region 50, and/or the SSBC 22 may be described as centered since the illustrated body contact region 44 is disposed in the center of the SSBC region 50 and in the center of the semiconductor device cell 46. Furthermore, once the SSBC 22 is formed, the body contact portion of the SSBC 22 will also be disposed in the center of the device cell 46, over the body contact region 44 illustrated in FIG. 3A. Additionally or alternatively, the semiconductor device cell 46, the SSBC region 50, and/or the SSBC 22 may be described as being symmetrical based on a number of mirror planes of symmetry, wherein the mirror planes of symmetry are oriented perpendicular to the semiconductor surface hosting the device cell 46 (i.e., oriented along the z axis, perpendicular to the x-y plane). For example, as illustrated in FIG. 3A, the semiconductor device cell 46, the SSBC region 50, and the SSBC 22 have two mirror planes of symmetry oriented along the z axis: the first is an x-z plane disposed at the center of the device cell 46, and the second is a y-z plane disposed at the center of the device cell 46, both of which evenly bisect the device cell 46, the SSBC region 50, and the SSBC 22. As discussed below with respect to FIG. 3B, in certain embodiments, the device cell 46 may have less than ideal alignment and/or feature definition due to manufacturing variances and tolerances. For such embodiments, it may be appreciated that the target structure (i.e., what was intended to be implemented based on the design) may be considered herein as centered and/or symmetrical, even though the actual structure of the device cell 46 as manufactured may include irregularities based on limitations of the fabrication process. For example, as discussed below with respect to FIG. 3B, in certain embodiments, the body contact region 44 may be slightly offset from the center of the device cell 46, the SSBC 22 may not be perfectly aligned with the channel region 48, the body contact region 44 may extend slightly above or below the SSBC 22, and so forth. However, the device cell 46 may still be considered centered and/or symmetrical based on the target structure, even when real-world manufactures may deviate from the target structure due to the variances introduced by the fabrication process.

FIG. 3A also demonstrates dimensions of the illustrated device cell 46. For example, FIG. 3A illustrates channel length ($L_{ch}$ 52), distance from the channel to the ohmic region ($L_{ch-to-ohm}$ 54), width of the ohmic region ($W_{ohm}$ 56), width of the source contact regions (e.g., $W_{n\_42A}$ 58A and $W_{n\_42B}$ 58B; $W_n = W_{n\_42A} + W_{n\_42B}$), width of the body contact region ($W_p$ 60), channel width ($W_{ch-Vertical}$ 62A and $W_{ch-Horizontal}$ 62B; $W_{ch} = 2W_{ch-Vertical} + 2W_{ch-Horizontal}$, ignoring corner conduction), device cell area (represented by the entire area surrounded by rectangle 46), and JFET area per unit cell (area of the JFET region 48) for the illustrated device cell 46. In certain embodiments, the distance from the channel to the ohmic region ($L_{ch-to-ohm}$ 54) may be defined by a minimum distance allowed by the fabrication process that still enables separation between the gate and source electrodes.

It may also be appreciated that the eventual position of the SSBC 22, represented by the dotted rectangle 22 illustrated in FIG. 3A, demonstrates ideal (e.g., perfect) alignment of the contact 22 as well as ideal (e.g., perfect) feature definition. That is, for the device 46 of FIG. 3A, the length of the contact 22 generally runs exactly parallel to the length of the n+ region 20. Further, the source contact region 44 of the device 46 does not substantially extend above or below the SSBC 22. It may be noted that, while ideal alignment and specific shape of the features are shown to simplify discussion, the present approach is not limited to these specific shapes, dimensions, or alignment. As such, while ideally or perfectly aligned devices (e.g. target device structures) are generally illustrated and discussed herein, it should be noted that, in certain embodiments, the SSBC (e.g., SSBC 22) of device cells of the present approach (e.g., device cells 46) may not be ideally or perfectly aligned, as shown in FIG. 3B, due to tolerances allowed in the manufacturing process.

Figure 3B:
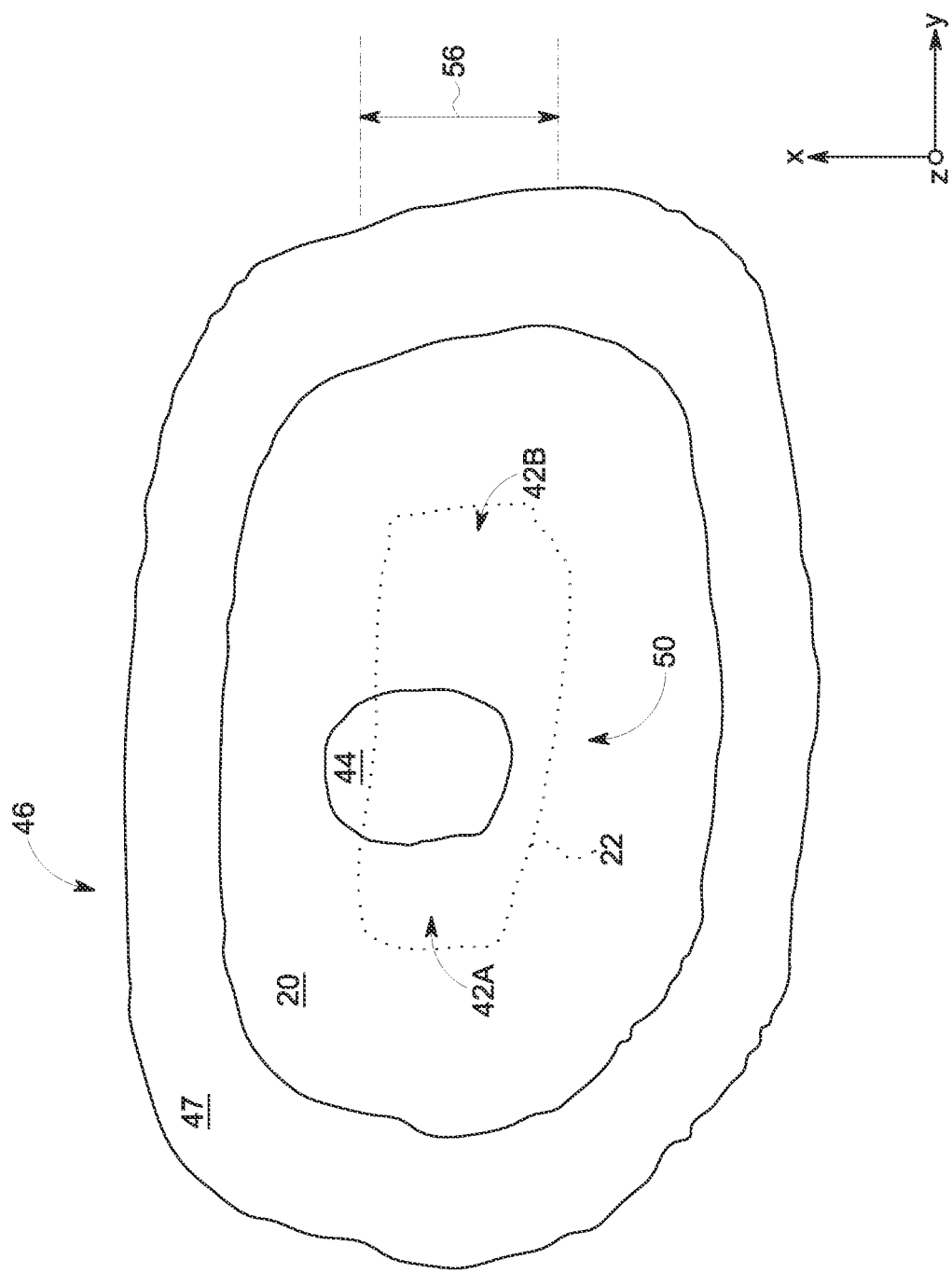
FIG. 3B is a top-down view of another embodiment of a device cell having a symmetrical SSBC region and showing exaggerated manufacturing imperfections.

For example, FIG. 3B illustrates an embodiment of a device 46 of the present approach that demonstrates less than ideal (e.g., imperfect) alignment of the contact 22 as well as less than ideal (e.g., imperfect) feature definition. As illustrated in FIG. 3B, in certain embodiments, the length of the SSBC 22 may not be perfectly parallel to the length of the n+ region 20 (e.g., offset intentionally or unintentionally by 1°, 2°, 3°, 4°, or 5° or more), based on limitations of alignment techniques used in semiconductor fabrication. As illustrated in FIG. 3B, in certain embodiments, the SSBC 22 may extend slightly above or below the source contact region 44 or the source contact region 44 may extend slightly above or below the SSBC 22, based on limitations of alignment techniques used in semiconductor fabrication. For example, in certain implementations, the SSBC 22 may extend beyond above and/or below the source contact region 44 by less than approximately 20% of $W_{ohm}$ 56 (e.g., total width of the contact 22), less than approximately 10% of $W_{ohm}$ 56, or less than approximately 5% of $W_{ohm}$ 56. It may also be appreciated that the shapes illustrated and discussed herein are representative of ideal or target shapes (e.g., rectangles, squares, hexagons, etc.) for the features (e.g., source contact region 44, n+ region 20, etc.) of the device 46. However, as illustrated in FIG. 3B, in certain implementations, these features may be somewhat modified by the limitations of the semiconductor fabrication techniques (e.g., photolithography), and may therefore actually appear as having rounder, softer, or generally less well-defined features than the target structure used in the design of a device. Accordingly, it should be appreciated that the present approach is applicable to both ideally aligned and/or shaped device cells (e.g., as illustrated in FIG. 3A), as well as device cells that are partially misaligned and/or that lack perfect feature definition (e.g., as illustrated in FIG. 3B).

Figure 3C:
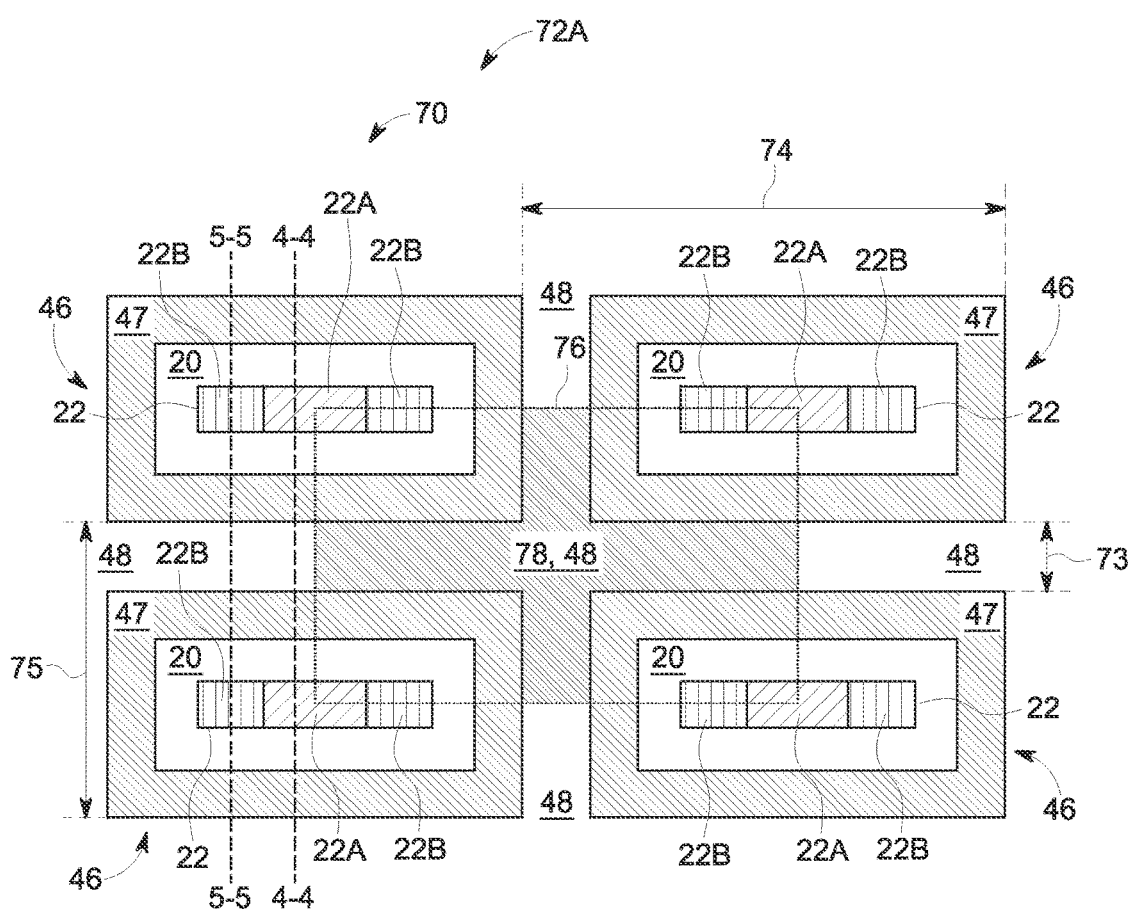
FIG. 3C is a top-down view of a SSBC cellular device layout having rectangular device cells with symmetric segmented source and body contacts (SSBCs), in accordance with embodiments of the present approach.

FIG. 3C is a top-down or plan view of a semiconductor surface 70 (e.g., a SiC epitaxial semiconductor layer) that includes an embodiment of a segmented source and body contact (SSBC) cellular device layout 72A that enables reduced on-state conduction losses, as set forth above. The illustrated SSBC cellular layout 72A includes a number of MOSFET device cells 46, like the device cell 46 of FIG. 3A discussed above. In particular, each illustrated device cell 46 in FIG. 3C includes a segmented source a segmented source and body contact (SSBC) 22 disposed over an underlying segmented source and body contact (SSBC) regions 50 (not shown), as discussed above with respect to FIG. 3A. That is, unlike FIG. 3A, the SSBCs 22 illustrated in FIG. 3C are illustrated as solids that hide from view the underlying segmented source and body contact (SSBC) regions 50 discussed above. Each illustrated SSBC 22 includes a body contact portion 22A as well as two source contact portions 22B, which may, in certain embodiments, be equal in dimensions (e.g., symmetric) or may have different dimensions (e.g., asymmetric). For the devices 46 illustrated in FIG. 3C, the body contact portion 22A of the SSBCs 22 is only partially (i.e., not completely) surrounded by the source contact portions 22B of the SSBCs 22. In other words, the source contact portions 22B of the SSBCs 22 are illustrated as being disposed on less than all sides (e.g. only two sides) of the body contact portions 22A of the SSBCs 22. For example, for embodiments having a differently shaped SSBCs 22, portions of the source contact portions 22B of the SSBCs 22 may be positioned along less than six sides, less than five sides, less than four sides, less than three sides, less than two sides, or only one side of a body contact portion 22A of the SSBCs 22.

FIG. 3C also demonstrates particular dimensions for the illustrated SSBC device layout 72A. For example, FIG. 3C illustrates width of the JFET region ($W_{JFET}$ 73), horizontal device cell pitch 74, vertical device cell pitch 75, device unit cell area ($A_{cell}$ 76, represented by the area encircled by dotted rectangle 76), and JFET area per unit cell ($A_{JFET}$ 78, represented by the cross-hatched portion 78 of the JFET region 48) for the illustrated embodiment of the SSBC device layout 72A. It may be appreciated that the term, "channel density" may be used herein to refer to the ratio of channel periphery of a particular device cell to the total area of the device cell. As such, for the SSBC device layout 72A illustrated in FIG. 3C, the channel density may be equal to the total channel perimeter of one device cell 46 divided by the area of the device cell ($A_{cell}$ 76) (e.g., $D_{channel}=(2L_{ch\_horizontal}+2L_{ch\_vertical})/A_{cell}$). It may also be appreciated that the term, "JFET density" may be used herein to refer to the ratio of the JFET area of a particular device cell to the total area of the device cell 46. As such, for the SSBC device layout 72A illustrated in FIG. 3C, the JFET density may be equal to the JFET area per cell ($A_{JFET}$ 78) divided by the area of one device cell ($A_{cell}$ 76) (e.g., $D_{JFET}=W_{JFET}$ (vertical_pitch+horizontal_pitch−$W_{JFET}$)/$A_{cell}$). As set forth below, the SSBC cellular layout 72A enables the reduction of device pitch, and thus, increases channel periphery per unit area and/or increases density of the JFET region 48 for the MOSFET device cells 46.

Figure 4:
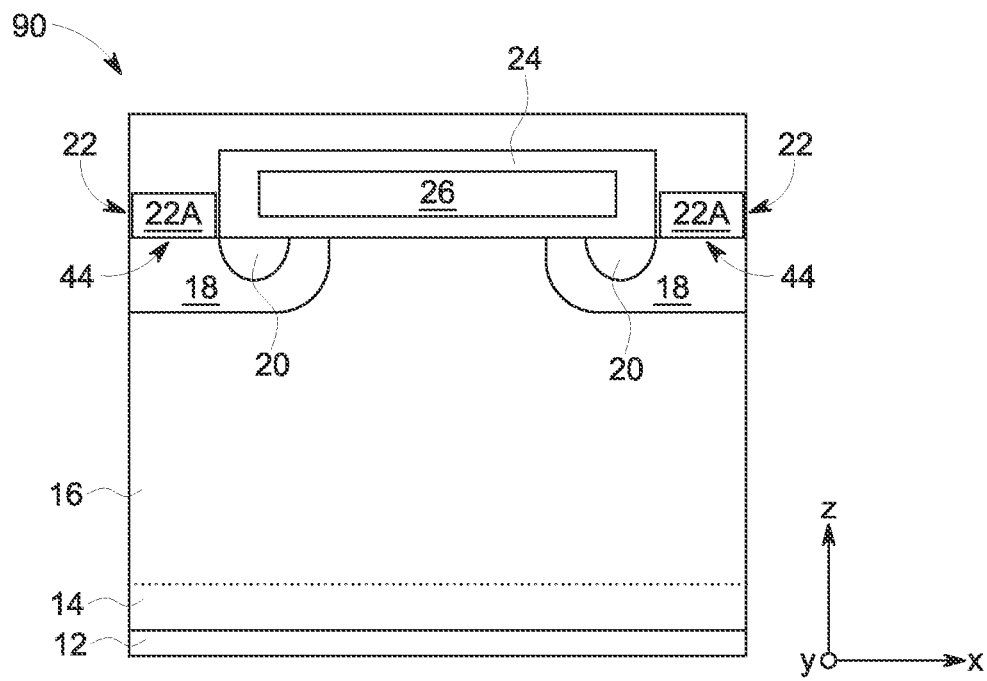
FIG. 4 is a cross-sectional view of a portion of the SSBC cellular device layout embodiment illustrated in FIG. 3C.

FIG. 4 is a cross-sectional view 90 of a portion of the MOSFET device cell layout 72A taken along line 4-4 of FIG. 3C. In particular, the cross-sectional view 90 demonstrates a portion of the MOSFET device cell device layout 72A after forming a gate electrode 26, dielectric layers 24, and the SSBC 22. As shown in FIG. 3C, the line 4-4 traverses the body contact portion 22A of the SSBC 22, which is disposed over the body contact region 44 of the SSBC region 50 of the MOSFET device cell 46, as discussed above with respect to FIG. 3A. Accordingly, for the embodiment illustrated in FIG. 4, the body contact portion 22A of the SSBC 22 is disposed over (e.g., in physical and electrical contact with) the p+ body contact region 44 at the surface of the p-well region 18. For the illustrated embodiment, the body contact portion 22A of the SSBC 22 is not disposed over (e.g., in physical or electrical contact with) the n+ region 20 within the cross-sectional view 90. However, in other embodiments, the body contact portion 22A of the contact 22 may be partially disposed over (e.g., in limited physical or electrical contact with) the n+ region 20, either intentionally or due to limitations of the semiconductor fabrication process.

Figure 5:
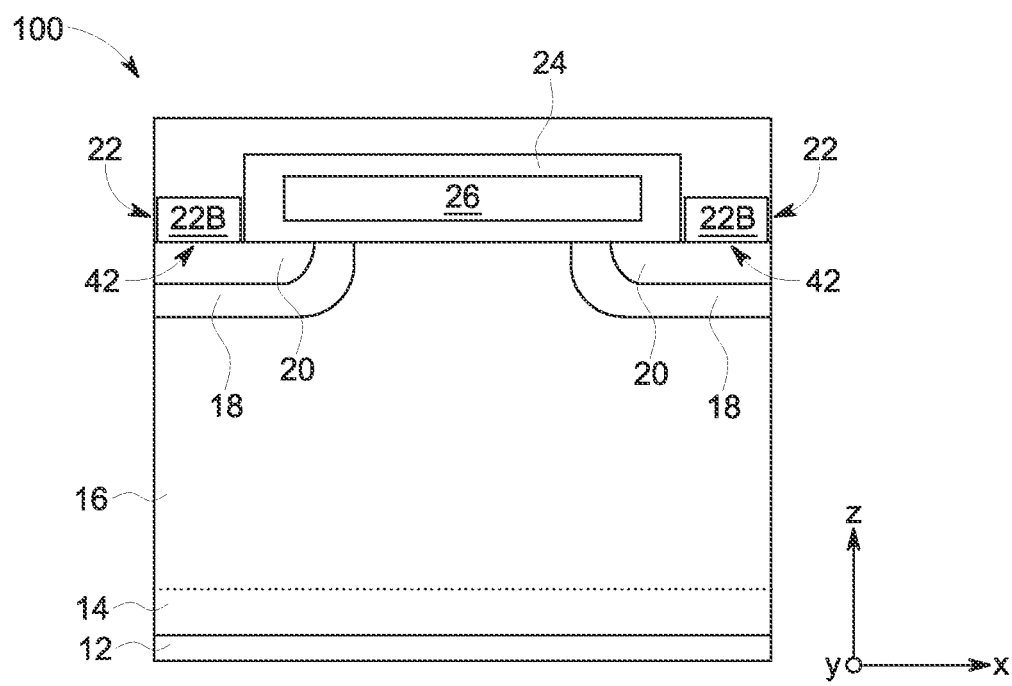
FIG. 5 is a cross-sectional view of another portion of the SSBC cellular device layout embodiment illustrated in FIG. 3C.

FIG. 5 is a cross-sectional view 100 of a MOSFET device cell layout 72A of FIG. 3C, taken along line 5-5. As with FIG. 4, the cross-sectional view 100 of FIG. 5 demonstrates the MOSFET device cell layout 72A after forming the gate electrode 26, dielectric layers 24, and the SSBC 22. As shown in FIG. 3C, the line 5-5 traverses the source contact portion 22B of the SSBC 22, which is disposed over the portion 42A of the source contact region 42 of the SSBC region 50 of MOSFET device cell 46, as discussed above with respect to FIG. 3A. Accordingly, for the embodiment illustrated in FIG. 5, the source contact portion 22B of the SSBC 22 is disposed over (e.g., in physical and electrical contact with) the n+ region 20. As such, for the illustrated cross-sectional view 100, the source contact portion 22B of the SSBC 22 is not is disposed over (e.g., in physical and electrical contact with) the p-well region 18 or the body contact region 44 within the cross-section view 100.

Figure 6:
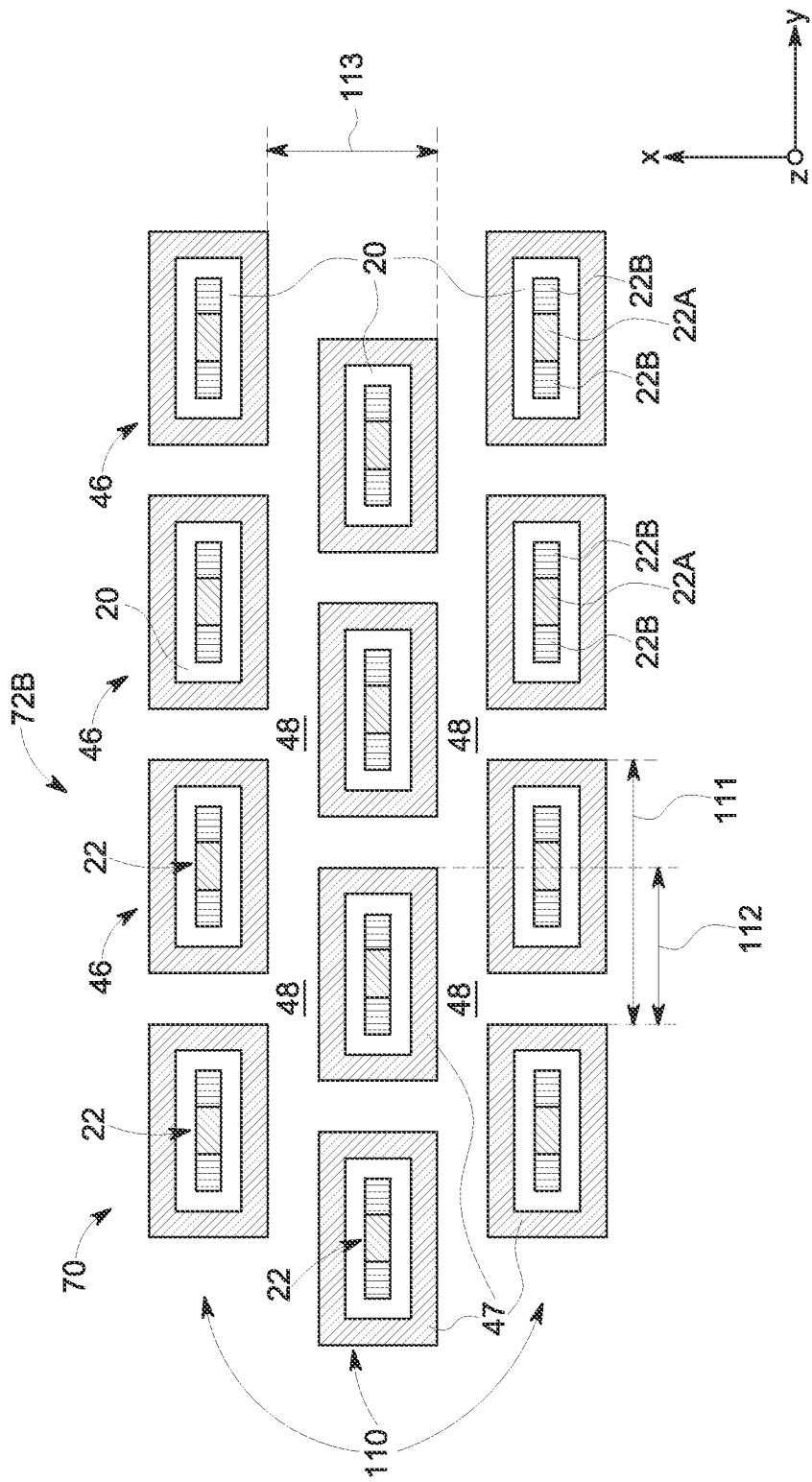
FIG. 6 is a top-down view of another embodiment of a SSBC cellular device layout having staggered rectangular device cells with symmetric SSBCs.

FIG. 6 is a top-down or plan view of a semiconductor substrate 70 that includes another embodiment of the SSBC device layout 72B. Like the SSBC device layout 72A illustrated in FIG. 3C, the SSBC device layout 72B illustrated in FIG. 6 includes a number of MOSFET device cells 46 having a SSBC 22, as described above, disposed over an underlying SSBC region 50 (not shown). That is, as set forth above with respect to FIG. 3A, the SSBC 22 includes a body contact portion 22A disposed over the body contact region 44 of each device cell 46, and further includes source contact portions 22B, which are disposed over the portions 42A and 42B of the source contact region 42. Further, the illustrated device cells 46 also include other features (e.g., JFET regions 48, channel regions 47, n+ regions 20), as discussed above. As such, for the SSBC device layout 72B of FIG. 6, disposed under each SSBC 22, the SSBC region 50 has a body contact region 44 surrounded on less than all sides (e.g. not completely surrounded) by the source contact regions 42A and 42B, as discussed with respect to FIG. 3A above. Accordingly, for the SSBC device layout 72B illustrated in FIG. 6, each SSBC 22 has a body contact portion 22A is surrounded on less than all sides (e.g., not completely surrounded) by one or more source contact portions 22B.

Additionally, as illustrated in FIG. 6, the device cells 46, the SSBCs 22, and the underlying SSBC region (not shown) of the device layout 72B may be described as being centered, in that the body contact portion 22A (and the underlying body contact region) are disposed in the center of the device cells 46. Additionally or alternatively, these features may be described as being symmetric in that the device cells 46, the SSBCs 22, and the underlying SSBC region (not shown) of the device layout 72B have at least two mirror planes of symmetry that are disposed perpendicular to the plane of the semiconductor surface (i.e., disposed along the z axis). For example, the illustrated device cells 46 each include at least two mirror planes of symmetry: a first mirror plane being the z-y plane that vertically bisects each device cell 46, and a second mirror plane being the z-x plane that horizontally bisects each device cell 46.

Like the SSBC device layout 72A illustrated in FIG. 3C, the MOSFET device cells 46 of the SSBC device layout 72B illustrated in FIG. 6 are disposed in rows 110. However, unlike the SSBC device layout 72A illustrated in FIG. 3C, each of the rows 110 of MOSFET device cells 46 in FIG. 6 are offset or staggered by a distance 112. The horizontal pitch 111 and vertical pitch 113 of the SSBC device layout 72B is also illustrated in FIG. 6. It may be appreciated that the staggered design of FIG. 6 enables reduced electric fields near the corners of p-well regions 18 and also in gate oxide 24 positioned above the center of JFET region, as illustrated in FIGS. 4 and 5. Accordingly, the staggered design of FIG. 6 may enable improved blocking voltage (BV) and device reliability compared to layout in FIG. 3C.

Figure 7:
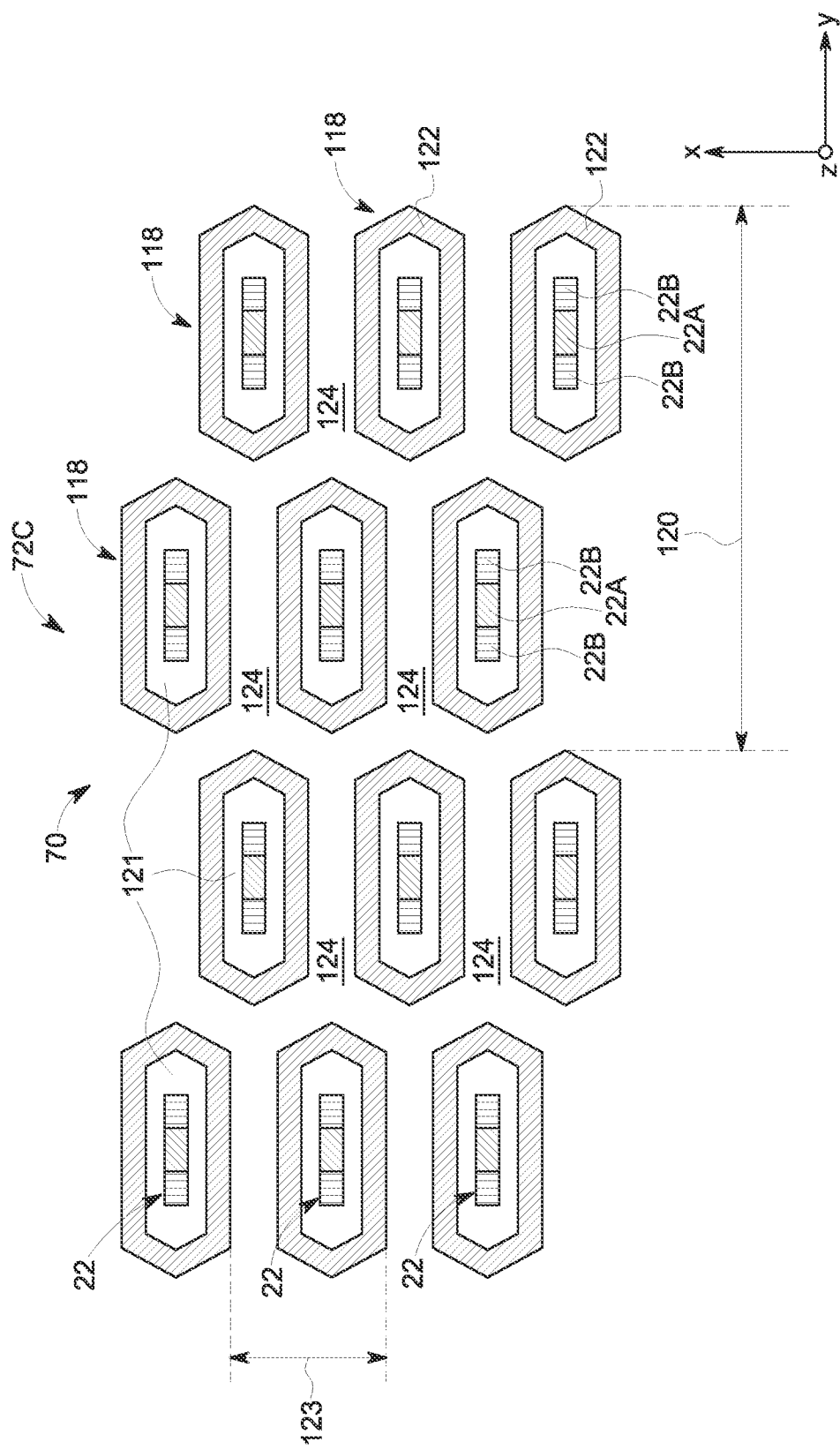
FIG. 7 is a top-down view of another embodiment of a SSBC cellular device layout having elongated hexagonal device cells with symmetric SSBCs.

FIG. 7 is a top-down or plan view of a semiconductor substrate 70 that includes another embodiment of the SSBC device layout 72C. Like the SSBC device layouts 72A-B illustrated in FIGS. 3B and 6, respectively, the SSBC device layout 72C illustrated in FIG. 7 includes a number of MOSFET device cells 118. The horizontal pitch 120 and the vertical pitch 123 of the SSBC device layout 72C is also illustrated in FIG. 7. Further, each of the MOSFET device cells 118 include the aforementioned SSBC 22, which is disposed over a SSBC region 50 (as discussed with respect to FIG. 3A above). Similarly, disposed under each SSBC 22, the SSBC region 50 (not shown) includes a body contact region 44 surrounded on less than all sides (e.g. not completely surrounded) by the source contact regions 42A and 42B, as discussed in FIG. 3A above.

Additionally, as illustrated in FIG. 7, the device cells 118, the SSBCs 22, and the underlying SSBC region (not shown) of the device layout 72C may be described as being centered, in that the body contact portion 22A (and the underlying body contact region) are disposed in the center of the device cells 118. Additionally or alternatively, these features may be described as being symmetric in that the device cells 118, the SSBCs 22, and the underlying SSBC region (not shown) of the device layout 72C have at least two mirror planes of symmetry that are disposed perpendicular to the plane of the semiconductor surface (i.e., disposed along the z axis). For example, the illustrated device cells 118 each include at least two mirror planes of symmetry: a first mirror plane being the z-y plane that vertically bisects each device cell 118, and a second mirror plane being the z-x plane that horizontally bisects each device cell 118.

The MOSFET device cells 118 illustrated in FIG. 7 each include an n+ doped region 121, which separates the SSBC regions 22 from the channel region 122 for each of the MOSFET device cells 118. The illustrated MOSFET device cells 118 also include a JFET region 124 surrounding the channel regions 122. Unlike the MOSFET device cells 46 illustrated in FIGS. 3A, 3C, and 6, the MOSFET device cells 118 illustrated in FIG. 7 have an elongated (e.g., stretched or expanded) hexagonal shape and "honeycomb" cell arrangement, which enables lower electric field near the corners of p-well regions 18 and also in gate oxide 24 above the center of JFET region. It may be appreciated that the SSBCs 22, and the underlying SSBC regions 50, enable reduced device pitch 123 relative to other hexagonal device cell layouts that do not utilize the present SSBC designs.

Figure 8:
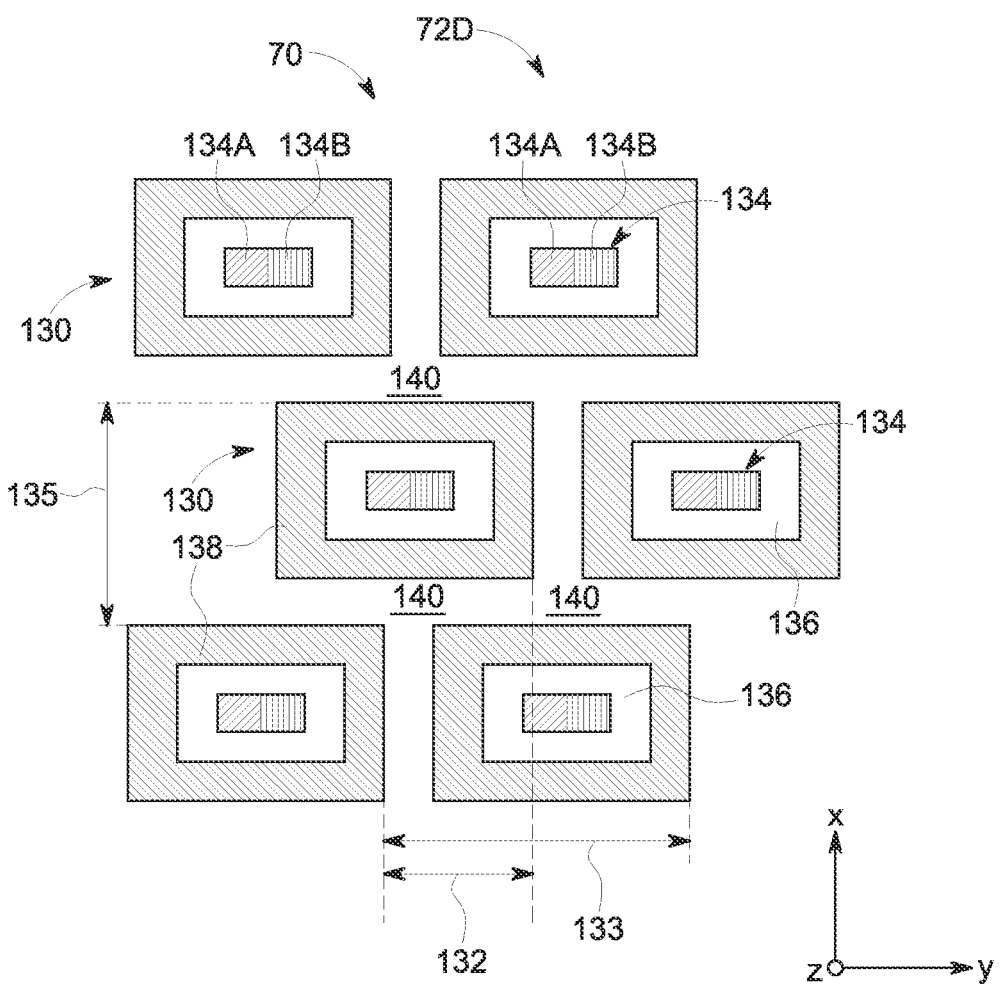
FIG. 8 is a top-down view of another embodiment of a SSBC cellular device layout having rectangular device cells with asymmetric SSBCs.

FIG. 8 is a top-down or plan view of a semiconductor substrate 70 that includes yet another embodiment of the SSBC device layout 72D. The SSBC device layout 72D illustrated in FIG. 8 includes a number of rectangular MOSFET device cells 130 disposed at a particular offset 132 relative to one another, each including a segmented source and body contact (SSBC) 134. The horizontal pitch 133 and vertical pitch 135 of the SSBC device layout 72D is also illustrated in FIG. 8. For the illustrated embodiment, the SSBC 134 is surrounded by an n+ doped region 136 that separates the SSBC 134 from the p-channel region 138 for each of the MOSFET device cells 130. The illustrated MOSFET device cells 130 also include a JFET region 140 surrounding the p-channel regions 138.

Each of the SSBCs 134 illustrated in FIG. 8 include a body contact portion 134A disposed beside (e.g., next to or adjacent to) a source contact portion 134B of the SSBC 134. The source contact portion 134B of the SSBC 134 is disposed along less than all sides of (e.g., does not completely surround, disposed along one side, along less than two sides, along less than three sides) the body contact portion 134A of the SSBC 134. Similarly, below each SSBC 134, the underlying SSBC region (not shown) includes a source contact region that is disposed along less than all sides of (e.g., does not completely surround, disposed along one side, along less than two sides, along less than three sides) the body contact region.

Additionally, the device cells 130, the SSBCs 134, and the underlying SSBC region (not shown) of the device layout 72D may be described as being off-centered, in that the body contact portion 134A (and the underlying body contact region) are not disposed in the center of the device cells 130. Additionally or alternatively, these features may be described as being asymmetric in that the device cells 130, the SSBCs 134, and the underlying SSBC region (not shown) of the device layout 72D have less than two mirror planes of symmetry that are disposed perpendicular to the plane of the semiconductor surface (i.e., disposed along the z axis). Indeed, the illustrated device cells 130 each include only one mirror plane of symmetry, which is disposed within the z-y plane that bisects each of the device cells 130.

Figure 9:
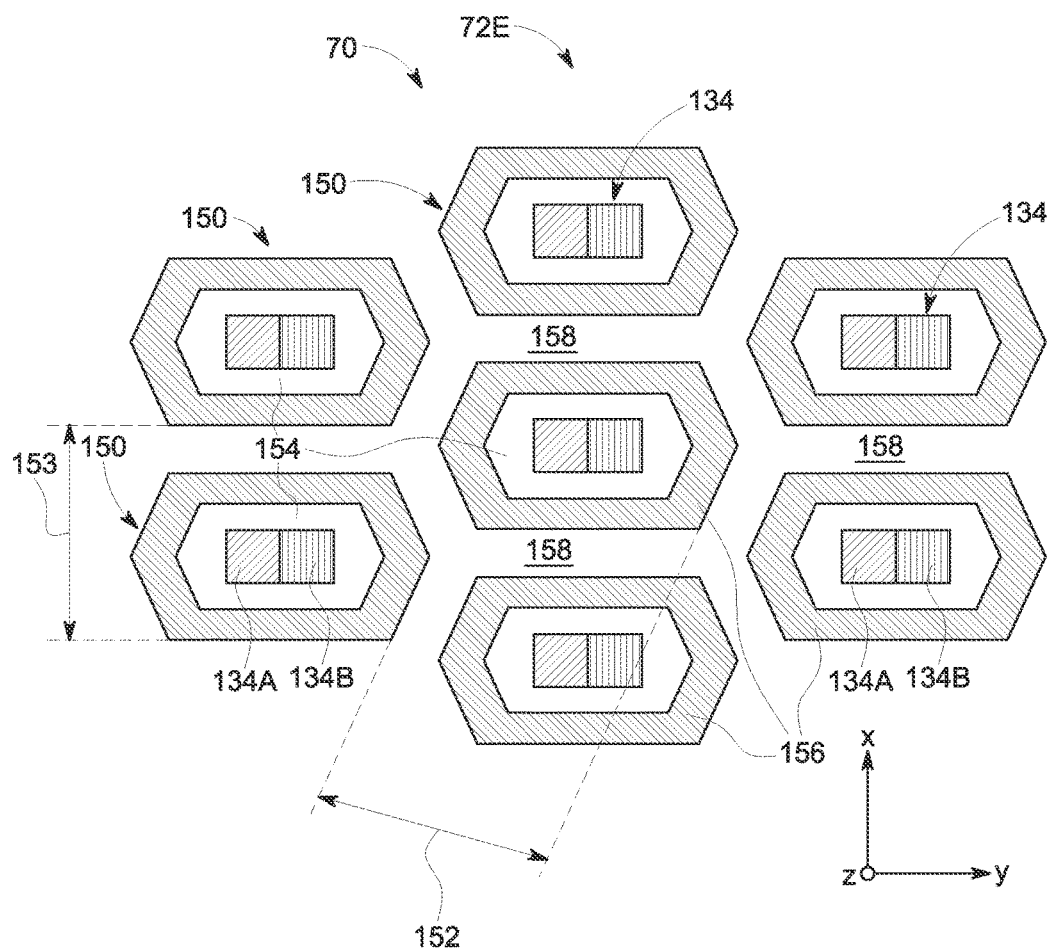
FIG. 9 is a top-down view of another embodiment of a SSBC cellular device layout having hexagonal device cells with asymmetric SSBCs.

FIG. 9 is a top-down or plan view of a semiconductor substrate 70 that includes yet another embodiment of the SSBC device layout 72E. The SSBC device layout 72E illustrated in FIG. 9 includes a number of elongated (e.g., stretched or expanded) hexagonal MOSFET device cells 150 disposed at a particular pitch 152 relative to one another. The vertical pitch 153 of the SSBC device layout 72E is also illustrated in FIG. 9. Like the MOSFET device cells 130 of FIG. 8, each of the illustrated MOSFET device cells 150 of FIG. 9 includes the SSBC 134. Each SSBC 134 includes a body contact portion 134A disposed beside (e.g., next to or adjacent to) a source contact portion 134B of the SSBC 134. As described above, the source contact portion 134B is disposed along less than all sides of (e.g., does not completely surround, disposed along one side, along less than two sides, along less than three sides) the body contact portion 134A for each of the illustrated SSBCs 134. Similarly, below each SSBC 134, the underlying SSBC region (not shown) includes a source contact region that is disposed along less than all sides of (e.g., does not completely surround, disposed along one side, along less than two sides, along less than three sides) the body contact region.

Additionally, the device cells 150, the SSBCs 134, and the underlying SSBC region (not shown) of the device layout 72E may be described as being off-centered, in that the body contact portion 134A (and the underlying body contact region) are not disposed in the center of the device cells 150. Additionally or alternatively, these features may be described as being asymmetric in that the device cells 150, the SSBCs 134, and the underlying SSBC region (not shown) of the device layout 72E have less than two mirror planes of symmetry that are disposed perpendicular to the plane of the semiconductor surface (i.e., disposed along the z axis). Indeed, the illustrated device cells 150 each include only one mirror plane of symmetry, which is disposed within the z-y plane that bisects each of the device cells 150.

For the illustrated layout 72E of FIG. 9, the SSBC 134 is surrounded by an n+ doped region 154 that separates the SSBC region 134 from the p-channel region 156 within each of the MOSFET device cells 150. The illustrated MOSFET device cells 150 also include a JFET region 158 surrounding the p-channel regions 156. It may be appreciated that, in certain embodiments, the hexagonal MOSFET device cells 150 illustrated in FIG. 9 and "honeycomb" cell arrangement enables lower electric field near the corners of p-well regions 18 and also in gate oxide 24 above the center of JFET region, as illustrated in FIGS. 4 and 5. Further, the SSBC 134 enables reduced device pitch 153 relative to other hexagonal device cell layouts that do not utilize the present SSBC designs.

Figure 10:
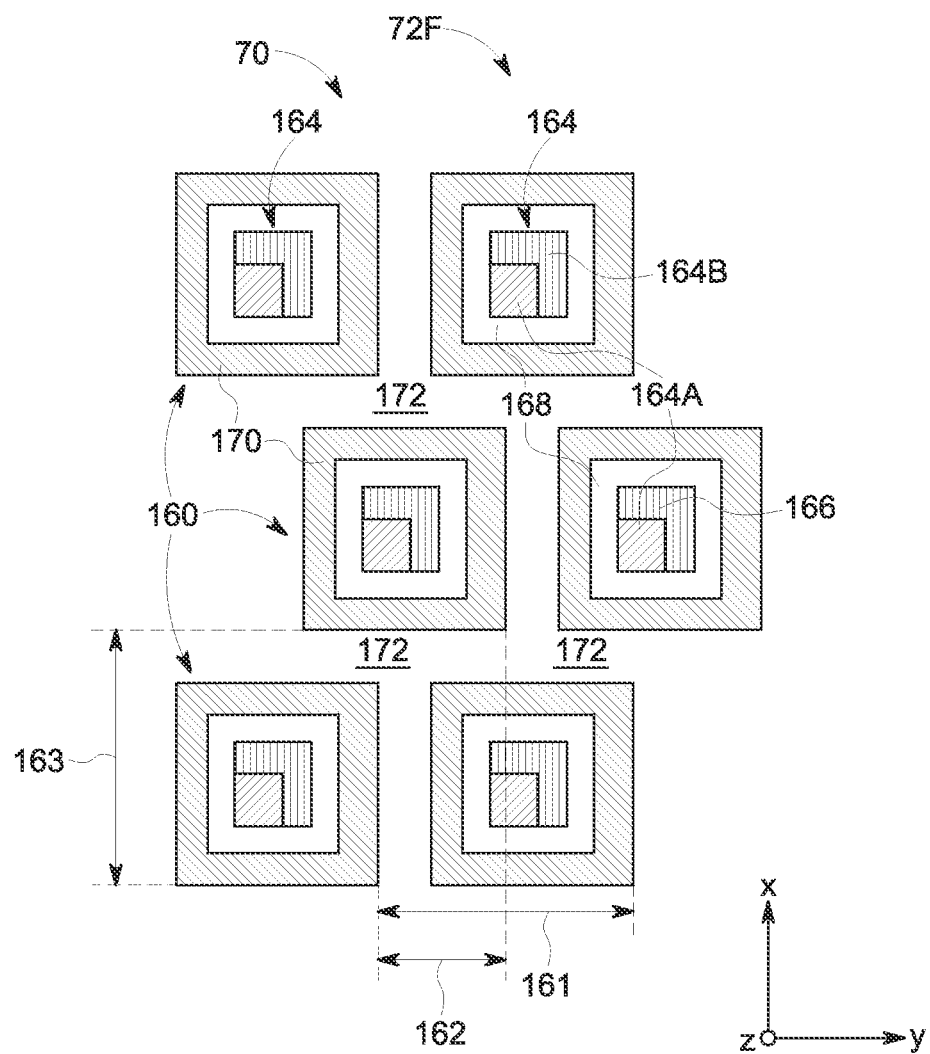
FIG. 10 is a top-down view of another embodiment of a SSBC cellular device layout having square device cells with asymmetric SSBCs.

FIG. 10 is a top-down or plan view of a semiconductor substrate 70 that includes yet another embodiment of the SSBC device layout 72F. The SSBC device layout 72F illustrated in FIG. 10 includes a number of square MOSFET device cells 160 disposed at a particular offset 162 relative to one another. The horizontal pitch 161 and vertical pitch 163 of the SSBC device layout 72F is also illustrated in FIG. 10. Each of the device cells 60 include a segmented source and body contact (SSBC) 164 that is disposed over a segmented source and body contact (SSBC) region (not shown). The SSBCs 164 are surrounded by an n+ doped region 168, which separates the SSBC region 164 from the p-channel region 170 for each of the MOSFET device cells 160. The illustrated MOSFET device cells 160 also include a JFET region 172 surrounding the p-channel regions 170.

The SSBCs 164 illustrated in FIG. 10 each include a body contact portion 164A disposed beside (e.g., next to or adjacent to) a source contact region 164B. The source contact portion 164B of the SSBC 164 is disposed along less than all sides of (e.g., does not completely surround, disposed along two sides of, along less than three sides of, along less than four sides of) the body contact portion 164A of the SSBC 164. In particular, the SSBCs 164 of FIG. 10 include an body contact portion 164A that is contacted on two sides by an "L"-shaped source contact portion 164B. In other words, the source contact portion 164B only partially surrounds or encircles the body contact portion 164A for each SSBC 164. It may be appreciated that, in certain embodiments, the square MOSFET device cells 160 illustrated in FIG. 10 may afford advantages over other MOSFET device cell shapes (e.g., designs lacking SSBC region 164) in terms of increased periphery of the channel region 170 and/or increased density of the JFET region 172.

Additionally, the device cells 160, the SSBCs 164, and the underlying SSBC regions (not shown) of the device layout 72F may be described as being off-centered, in that the body contact portions 164A (and the underlying body contact region) are not disposed in the center of the device cells 160. Additionally or alternatively, these features may be described as being asymmetric in that the device cells 160, the SSBCs 164, and the underlying SSBC region (not shown) of the device layout 72F have less than two mirror planes of symmetry that are disposed perpendicular to the plane of the semiconductor surface (i.e., disposed along the z axis). Indeed, the illustrated device cells 150 each include only one mirror plane of symmetry oriented along the z axis that diagonally bisects each of the device cells 160.

Figure 11:
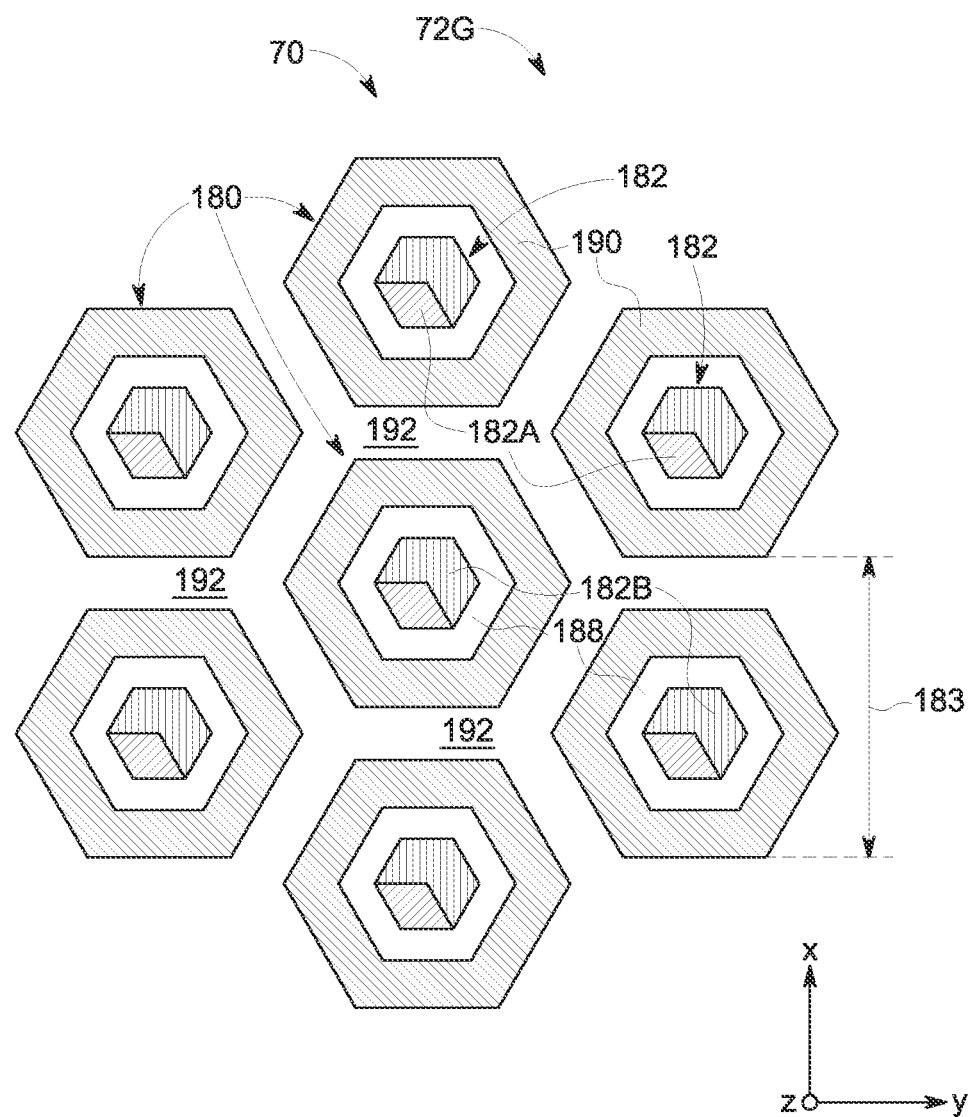
FIG. 11 is a top-down view of another embodiment of a SSBC cellular device layout having hexagonal device cells with asymmetric SSBCs.

FIG. 11 is a top-down or plan view of a semiconductor substrate 70 that includes yet another embodiment of the SSBC device layout. The SSBC device layout 72G illustrated in FIG. 11 includes a number of hexagonal MOSFET device cells 180, each including a segmented source and body contact (SSBC) 182. Additionally, the MOSFET device cells 180 of the SSBC device layout 72F are disposed at a particular pitch 183 (e.g., vertical pitch=horizontal pitch for regular hexagonal shape) relative to one another. For the illustrated embodiment, each of the SSBCs 182 is surrounded by a n+ region 188 that separates the SSBC 182 from the channel region 190 for each of the MOSFET device cells 180. The illustrated MOSFET device cells 180 also include a JFET region 192 surrounding the p-channel regions 190.

The SSBCs 182 illustrated in FIG. 11 each include body contact portion 182A disposed beside (e.g., next to or adjacent to) a source contact portion 182B. The source contact portion 182B of the SSBC 182 is disposed along less than all sides of (e.g., does not completely surround, disposed along two sides of, along less than three sides of, or along less than four sides of) the body contact portion 182A of the SSBC 182. It may be appreciated that the shape and positioning of the SSBC 182 in FIG. 11 is merely provided as an example. For example, as illustrated, the SSBCs 182 are positioned in the center of each hexagonal device cell 180 and include a kite-shaped body contact portion 182A and a chevron-shaped source contact portion 182B. In other embodiments, the shape and/or relative size of the body contact portion 182A and the source contact portion 182B may be different depending, for example, on contact resistance and device design requirements. It may also be appreciated that, in certain embodiments, the hexagonal MOSFET device cells 180 illustrated in FIG. 11 may afford advantages over rectangular or square-shaped MOSFET device cells 46, 130, and 160 in terms of increased periphery of the channel region 190 and/or increased density of the JFET region 192. The device layout 72G also enables lower electric field near the corners of p-well regions 18 and also in gate oxide 24 above the center of JFET region. Further, the SSBC 182 enables reduced device pitch relative to other hexagonal device cell layouts that do not utilize the present SSBC designs.

Additionally, the device cells 180, the SSBCs 182, and the underlying SSBC region (not shown) of the device layout 72G may be described as being off-centered, in that the body contact portion 182A (and the underlying body contact region) are not disposed in the center of the device cells 180. Additionally or alternatively, these features may be described as being asymmetric in that the device cells 180, the SSBCs 182, and the underlying SSBC region (not shown) of the device layout 72G have less than two mirror planes of symmetry that are disposed perpendicular to the plane of the semiconductor surface (i.e., disposed along the z axis). Indeed, the illustrated device cells 180 each include only one mirror plane of symmetry oriented along the z axis that diagonally bisects each of the device cells 180.

Figure 12A:
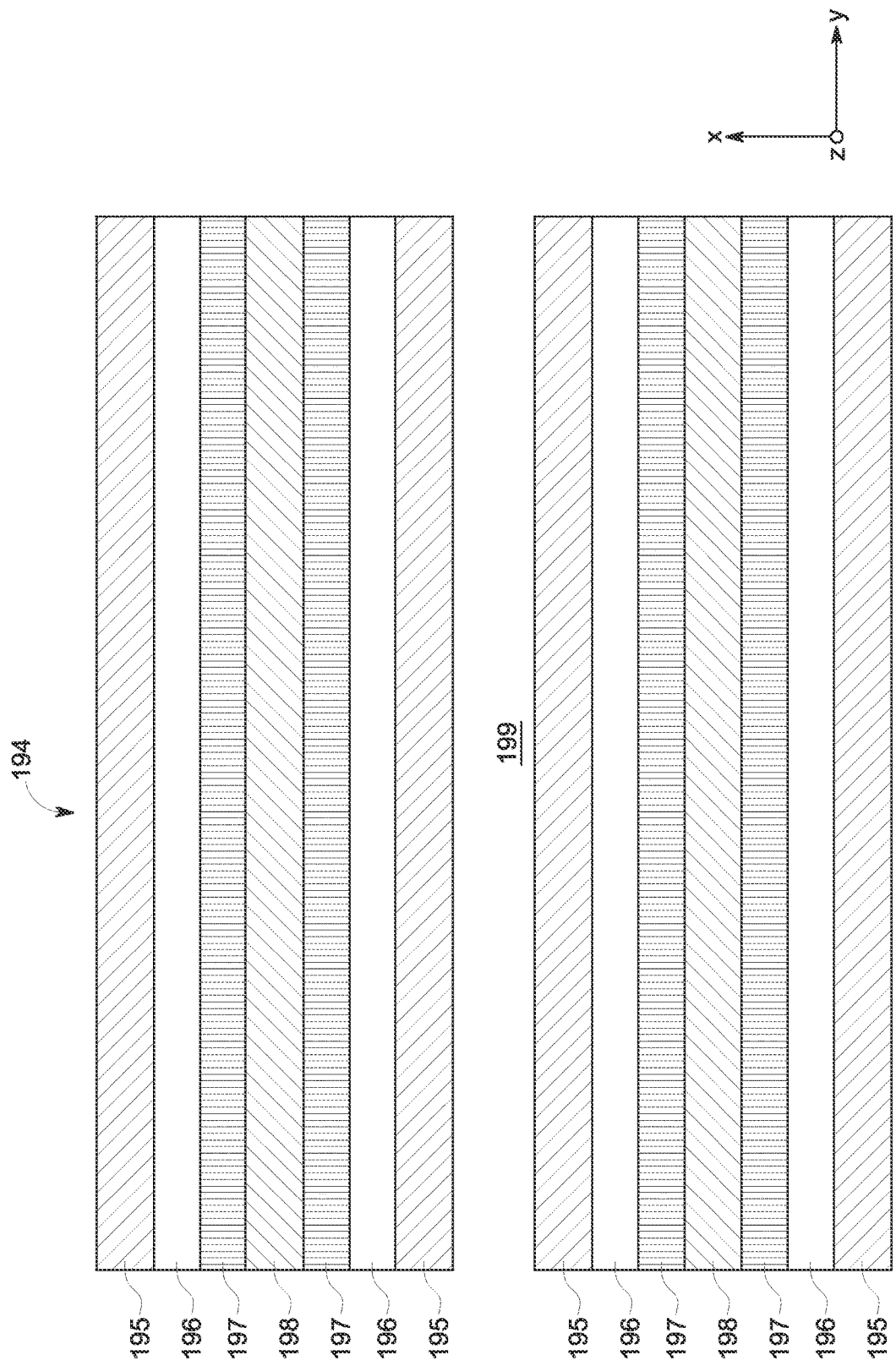
FIG. 12A is a top-down view of an embodiment of a non-cellular stripe device layout including continuous source contact stripes and continuous body contact stripes.
Figure 12B:
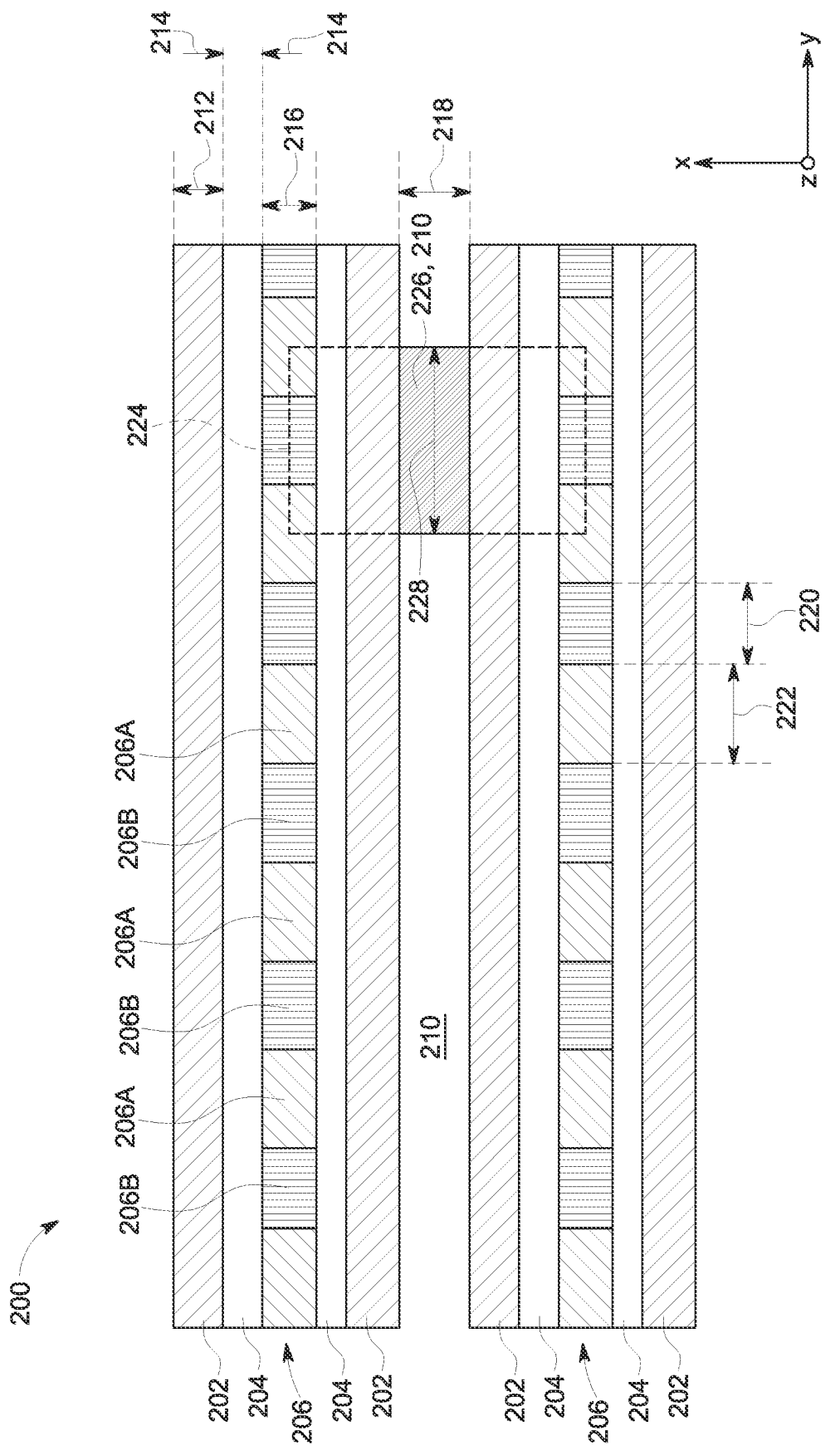
FIG. 12B is a top-down view of an embodiment of a non-cellular stripe ladder device layout having segmented source/body contact stripes.

It may be appreciated that the disclosed SSBC cellular device layout embodiments 72A-G enable performance advantages over other device layouts and device cell designs. For comparison, an example of another device layout is illustrated in FIG. 12A, which is a top-down or plan view of a stripe device layout 194 (i.e., a non-cellular layout). The illustrated stripe layout 194 of FIG. 12A includes: channel regions 195, n+ regions 196, source contact regions 197, body contact regions 198, and JFET region 199. It may be appreciated that the source contact regions 197 and the body contact regions 198 are formed as continuous stripes along the surface of the semiconductor for the illustrated stripe layout 194 of FIG. 12A. An example of another device layout is illustrated in FIG. 12B, which is a top-down or plan view of a stripe ladder device layout 200 (i.e., a non-cellular layout) with segmented source/body contacts. The illustrated layout 200 includes: channel regions 202, n+ regions 204, the segmented source/body contacts 206 (including the body contact portion 206A and the source contact portion 206B), and JFET region 210. FIG. 12B further illustrates dimensions of the stripe ladder device layout 200, including: channel length ($L_{ch}$ 212), distance from the channel to the ohmic region ($L_{ch-to-ohm}$ 214), width of the ohmic region ($W_{ohm}$ 216), width of the JFET region ($W_{JFET}$ 218), length of the source contact region segment ($L_n$ 220), length of the body contact region segment ($L_p$ 222), subset of device area ($A_{cell}$ 224 represented by the dashed rectangle 224), JFET area within $A_{cell}$ 224 ($A_{JFET}$ 226 represented by the cross-hatched area 226), and width of the channel ($W_{ch}$ 228) within $A_{cell}$ 224 for the illustrated stripe ladder device layout 200. For further comparison, another example of device layout is illustrated in FIG. 12C, is greater than the channel width 228 provided by the stripe "ladder" layout 200 of FIG. 12B (i.e., $W_{ch\ Stripe}$).

Figure 12C:
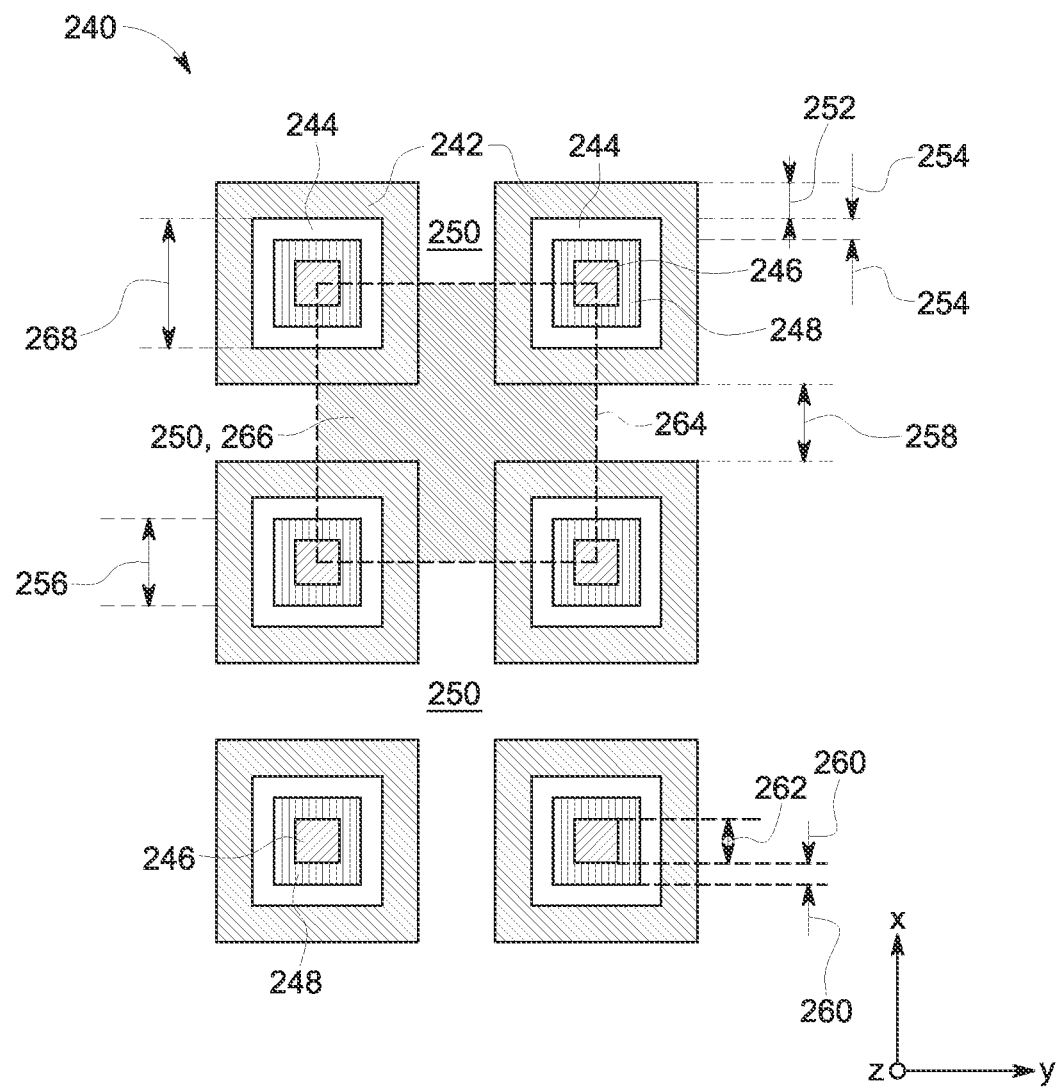
FIG. 12C is a top-down view of an embodiment of a cellular device layout including square device cells lacking SSBCs.

By further example, Eq. 3 describes a ratio of the channel width ($W_{ch}$) provided by the presently disclosed SSBC cellular device layout 72A (indicated by the "SSBC" subscript) to the channel width (e.g., $4*W_{ch/4}$ 268) provided by the square cellular layout 240 (indicated by the "SC" subscript) of FIG. 12C. It may be appreciated that Eq. 3 is derived and simplified by assuming the same design rules and technological limitations (e.g., $L_{ch}$, $L_{ch\_to\_ohm}$, $W_{ohm}$, $W_{JFET}$, $W_n$, and $W_p$) for the two compared designs. From Eq. 3, the inequality of Eq. 4 may be derived, which mathematically demonstrates device dimensions for which the channel width ($W_{ch}$) provided by the presently disclosed SSBC cellular device layout 72A (i.e., $W_{ch\ SSBC}$) is greater than the channel width 268 provided by the square cellular layout 240 of FIG. 12C (i.e., $W_{ch\ SC}$).

$$\frac{W_{ch_{SSBC}}}{W_{ch_{Stripe}}} = \frac{4L_{ch-to-ohm} + W_n + W_p + W_{ohm}}{W_{JFET} + 2L_{ch} + 2L_{ch-to-ohm} + W_n + W_p} \qquad \text{Eq. 1}$$

$$W_{ch_{SSBC}} > W_{ch_{Stripe}} \text{ if } 2L_{ch-to-ohm} + W_{ohm} > 2L_{ch} + W_{JFET} \qquad \text{Eq. 2}$$

$$\frac{W_{ch_{SSBC}}}{W_{ch_{SC}}} = \left( \frac{(2L_{ch-to-ohm} + W_n + W_p) + (2L_{ch-to-ohm} + W_{ohm})}{(2L_{ch-to-ohm} + W_n + W_p + 2L_{ch} + W_{JFET_{SSBC}}) \cdot (2L_{ch-to-ohm} + W_{ohm} + 2L_{ch} + W_{JFET})} \right) \left( \frac{(2L_{ch-to-ohm} + W_n + W_p) \cdot 2}{(2L_{ch-to-ohm} + W_n + W_p + 2L_{ch} + W_{JFET})^2} \right) \qquad \text{Eq. 3}$$

$$W_{ch_{SSBC}} > W_{ch_{SC}} \text{ if } (4L_{ch-to-ohm} + W_n + W_p + W_{ohm}) \cdot (2L_{ch} + 2L_{ch-to-ohm} + W_n + W_p + W_{JFET}) > \qquad \text{Eq. 4}$$
$$2 \cdot (2L_{ch-to-ohm} + W_n + W_p) \cdot (2L_{ch} + 2L_{ch-to-ohm} + W_{ohm} + W_{JFET})$$

which is a top-down or plan view of a square cellular device layout 240 that does not include segmented source/body contacts. The square cellular device layout 240 includes: channel regions 242, n+ regions 244, body contact 246, source contact 248, and JFET regions 250. FIG. 12C further illustrates dimensions of the square cellular device layout 240, including: channel length ($L_{ch}$ 252), distance from the channel to the ohmic region ($L_{ch-to-ohm}$ 254), width of the ohmic region ($W_{ohm}$ 256), width of the JFET region ($W_{JFET}$ 258), half of the width of the source contact region ($W_n/2$ 260), width of the body contact region ($W_p$ 262), device cell area ($A_{cell}$ represented by the dashed rectangle 264), JFET area per cell ($A_{JFET}$ represented by the cross-hatched area 266), and a quarter of the inner channel width ($W_{ch/4}$ 268; $W_{ch}=4W_{ch/4}$) for the illustrated cell of the square cellular device layout 240.

With the foregoing in mind, the presently disclosed embodiments of the SSBC cellular device layout 72A-G enable performance advantages over other device layouts and device cell designs by providing a greater channel width (e.g., a more channel periphery) than other device layouts. For example, Eq. 1 describes a ratio of the channel width ($W_{ch}$) provided by the presently disclosed SSBC cellular device layout 72A (indicated by the "SSBC" subscript) illustrated in FIGS. 3A and 3C to the channel width 228 provided by the stripe "ladder" layout 200 (indicated by the "stripe" subscript) of FIG. 12B. It may be appreciated that Eq. 1 is derived and simplified by assuming the same design rules and technological limitations (e.g., $L_{ch}$, $L_{ch\_to\_ohm}$, $W_{ohm}$, $W_{JFET}$, $W_n$, and $W_p$) for the two compared designs. From Eq. 1, the inequality of Eq. 2 may be derived, which mathematically demonstrates device dimensions for which the channel width ($W_{ch}$) provided by the presently disclosed cellular device layout having SSBC regions (i.e., $W_{ch\ SSBC}$)

The presently disclosed cellular device layout embodiments 72A-G may also enable performance advantages over other device layouts and device cell designs by providing a greater JFET region density than other device layouts. For example, Eq. 5 describes a ratio of the JFET region density (e.g., illustrated as $A_{JFET}$ 78 divided by $A_{cell}$ 76 in FIG. 3C) that is provided by the presently disclosed SSBC cellular device layout 72A (designated by the "SSBC" subscript) to the JFET region density (e.g., illustrated as $A_{JFET}$ 226 divided by $A_{cell}$ 224 in FIG. 12B) that is provided by the stripe "ladder" layout 200 (designated by the "Stripe" subscript). It may be appreciated that Eq. 5 is derived and simplified by assuming the same design rules and technological limitations (e.g., $L_{ch}$, $L_{ch\_to\_ohm}$, $W_{ohm}$, $W_{JFET}$, $W_{ch}$, and $W_p$) for the two compared designs. From Eq. 5, the inequality of Eq. 6 may be derived, which mathematically demonstrates device dimensions for which the JFET region density provided by the presently disclosed SSBC cellular device layout 72A (i.e., $D_{JFET\ SSBC}$) is greater than the JFET region density provided by the stripe "ladder" layout 200 of FIG. 12B (i.e., $D_{JFET\ Stripe}$).

By further example, Eq. 7 describes a ratio of the JFET region density (e.g., illustrated as $A_{JFET}$ 78 divided by $A_{cell}$ 76 in FIG. 3C) that is provided by the presently disclosed SSBC cellular device layout 72A (designated by the "SSBC" subscript) to the JFET region density (e.g., illustrated as $A_{JFET}$ 266 divided by $A_{cell}$ 264 in FIG. 12C) provided by the square cellular layout 240 (designated by the "SC" subscript). It may be appreciated that Eq. 7 is derived and simplified by assuming the same design rules and technological limitations (e.g., $L_{ch}$, $L_{ch\_to\_ohm}$, $W_{ohm}$, $W_{JFET}$, $W_n$, and $W_p$) for the two compared designs. From Eq. 7, the inequality of Eq. 8 may be derived, which mathematically demonstrates device dimensions for which the JFET region density provided by the presently disclosed SSBC cellular device layout 72A (i.e., $D_{JFET\ SSBC}$) is greater than the JFET density provided by the square cellular layout 240 of FIG. 12C (i.e., $D_{JFET\ SC}$). It may be appreciated that, for the Eq. 5-8, conduction through corner channel region is not taken into account, which is a valid assumption whenever $(2L_{ch\text{-}to\text{-}ohm}\ W_{ohm})$ is much greater than $L_{ch}$.

$$\frac{D_{JFET_{SSBC}}}{D_{JFET_{Stripe}}} = \frac{4L_{ch} + 4L_{ch-to-ohm} + W_n + W_p + W_{ohm}}{W_{JFET} + 2L_{ch} + 2L_{ch-to-ohm} + W_n + W_p} \qquad \text{Eq. 5}$$

$$D_{JFET_{SSBC}} > D_{JFET_{Stripe}} \text{ if } (2L_{ch} + 2L_{ch-to-ohm} + W_{ohm}) > W_{JFET} \qquad \text{Eq. 6}$$

$$\frac{D_{JFET_{SSBC}}}{D_{JFET_{SC}}} = \left( \frac{(2L_{ch-to-ohm} + W_n + W_p + 2L_{ch}) + (2L_{ch-to-ohm} + W_{ohm} + 2L_{ch})}{(2L_{ch-to-ohm} + W_n + W_p + 2L_{ch} + W_{JFET}) \cdot (2L_{ch-to-ohm} + W_{ohm} + 2L_{ch} + W_{JFET})} \right) \bigg/ \left( \frac{(2L_{ch-to-ohm} + W_n + W_p + 2L_{ch}) \cdot 2}{(2L_{ch-to-ohm} + W_n + W_p + 2L_{ch} + W_{JFET})^2} \right) \qquad \text{Eq. 7}$$

$$D_{JFET_{SSBC}} > D_{JFET_{SC}} \text{ if } (4L_{ch} + 4L_{ch-to-ohm} + W_n + W_p + W_{ohm}) \cdot (2L_{ch} + 2L_{ch-to-ohm} + W_n + W_p + W_{JFET}) > \qquad \text{Eq. 8}$$
$$2(2L_{ch} + 2L_{ch-to-ohm} + W_n + W_p) \cdot (2L_{ch} + 2L_{ch-to-ohm} + W_{ohm} + W_{JFET})$$

Figure 13:
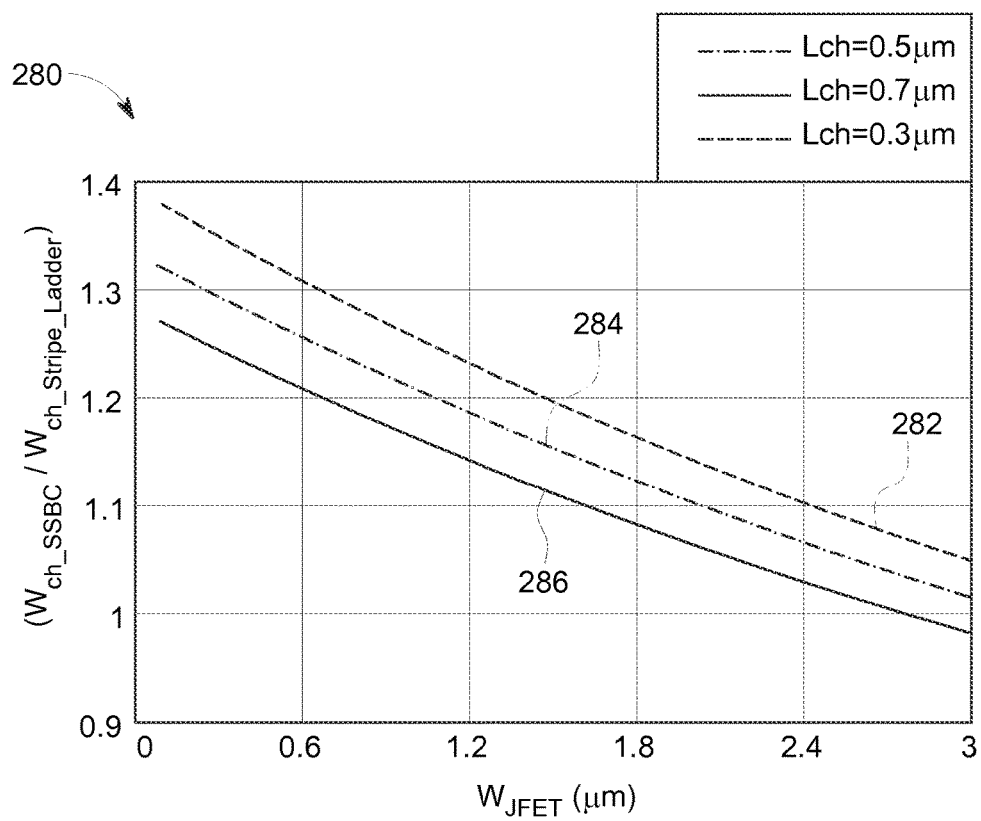
FIG. 13 is a graph illustrating the relationship between normalized channel width ($W_{ch}$) (normalized to the channel width of stripe ladder device layout 200 of FIG. 12B) and the width of the JFET region ($W_{JFET}$) for SSBC cellular device layout embodiments having different channel lengths ($L_{ch}$)

FIG. 13 is a graph 280 depicting Eq. 1 (i.e., channel width ($W_{ch}$) of SSBC cellular device layout 72A of FIG. 3C normalized to the channel width 228 of the stripe ladder device layout 200 of FIG. 12B) for devices having three different channel lengths. In particular, the graph 280 illustrated in FIG. 13 includes a curve 282 representing devices having a channel length ($L_{ch}$) of 0.3 μm, a curve 284 representing devices having a channel length ($L_{ch}$) of 0.5 μm, and a curve 286 representing devices having a channel length ($L_{ch}$) of 0.7 μm. Further, it may be appreciated that, for the illustrated curves 282, 284, and 286: $L_{ch\text{-}to\text{-}ohm}$=1.3 μm, $W_{ohm}$=1.6 μm, $W_n$=3 μm, and $W_p$=3 μm. Accordingly, the curves 282, 284, and 286 illustrate the increased channel width ($W_{ch}$) enabled by the SSBC device layout 72A of FIG. 3C relative to channel width 228 of stripe ladder device layout 200 of FIG. 12B. For example, in certain embodiments, as illustrated in FIG. 13, the SSBC device layout 72A may enable a channel width that is between approximately 1% and approximately 40% greater that the channel width of the stripe ladder device layout 200.

Figure 14:
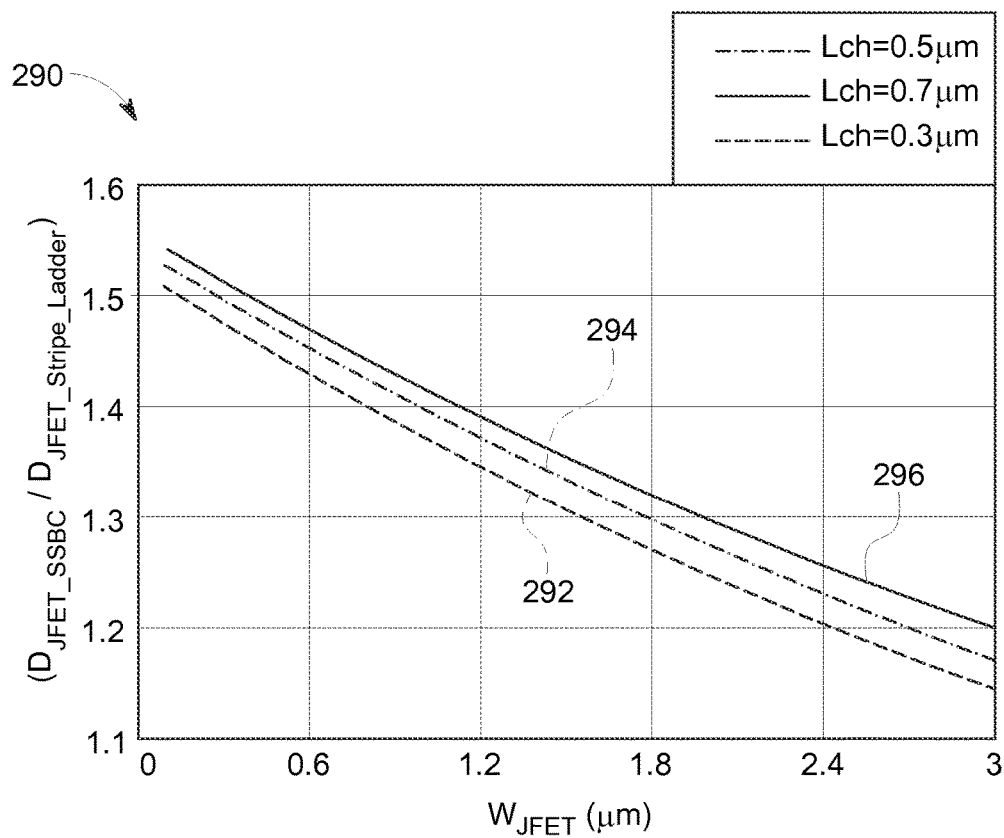
FIG. 14 is a graph illustrating the relationship between normalized JFET density ($D_{JFET}$) (normalized to the JFET density in stripe ladder device layout of FIG. 12B) and the width of the JFET region ($W_{JFET}$) for SSBC cellular device layout embodiments having different channel lengths ($L_{ch}$)

FIG. 14 is a graph 290 depicting Eq. 5 (i.e., JFET density of SSBC cellular device layout 72A of FIG. 3C normalized to the JFET density of the stripe ladder device layout 200 of FIG. 12B) for devices having three different channel lengths. In particular, the graph 290 illustrated in FIG. 14 includes a curve 292 representing devices having a channel length ($L_{ch}$) of 0.3 μm, a curve 294 representing devices having a channel length ($L_{ch}$) of 0.5 μm, and a curve 296 representing devices having a channel length ($L_{ch}$) of 0.7 μm. Further, it may be appreciated that, for the illustrated curves 292, 294, and 296: $L_{ch\text{-}to\text{-}ohm}$=1.3 μm, $W_{ohm}$=1.6 μm, $W_n$=3 μm, and $W_p$=3 μm. Accordingly, the curves 292, 294, and 296 illustrate the increased JFET density ($D_{JFET}$) enabled by the SSBC cellular device layout 72A of FIG. 3C relative to the stripe ladder device layout 200 of FIG. 12B. For example, in certain embodiments, as illustrated in FIG. 14, the SSBC device layout 72A may enable a JFET density that is between approximately 1% and approximately 60% greater that the JFET density of the stripe ladder device layout 200.

Figure 15:
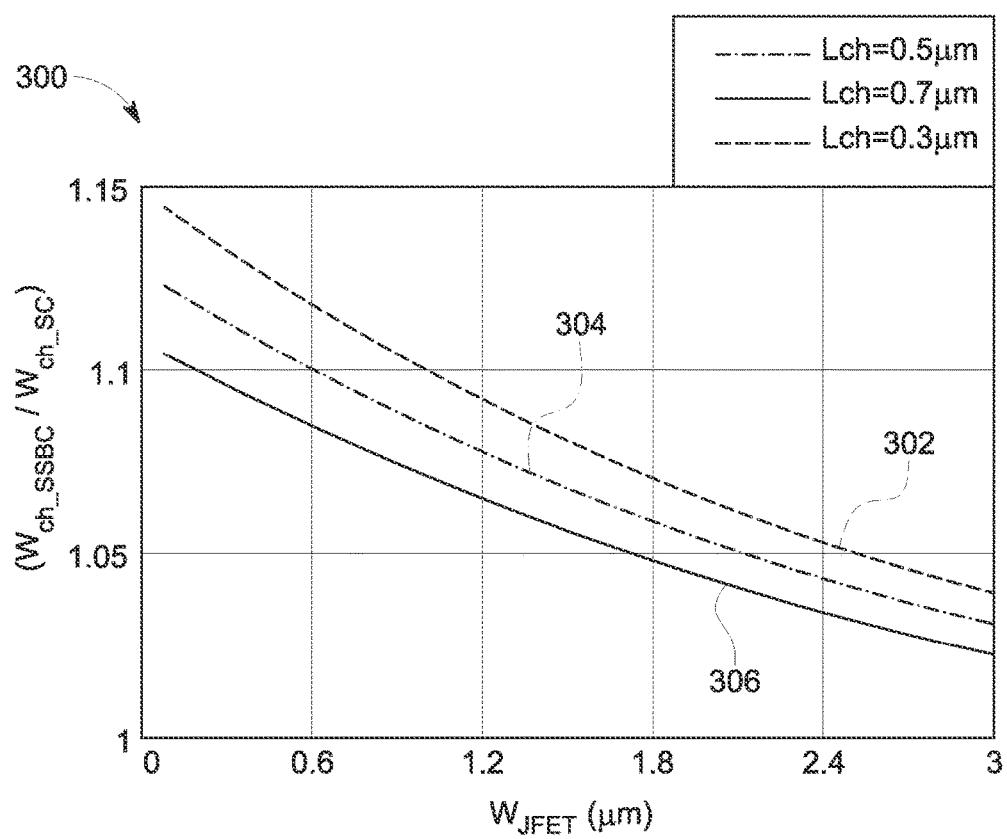
FIG. 15 is a graph illustrating the relationship between normalized channel width ($W_{ch}$) (normalized to the channel width of square cellular device layout of FIG. 12C) and the width of the JFET region ($W_{JFET}$) for SSBC cellular device layout embodiments having different channel lengths ($L_{ch}$)

FIG. 15 is a graph 300 depicting Eq. 3 (i.e., channel width ($W_{ch}$) of SSBC cellular device layout 72A of FIG. 3C normalized to the channel width 268 of the square cellular layout 240 of FIG. 12C) for devices having three different channel lengths. In particular, the graph 300 illustrated in FIG. 15 includes a curve 302 representing devices having a channel length ($L_{ch}$) of 0.3 μm, a curve 304 representing devices having a channel length ($L_{ch}$) of 0.5 μm, a curve 306 representing devices having a channel length ($L_{ch}$) of 0.7 μm. Further, it may be appreciated that, for the curves 302, 304, and 306: $L_{ch\text{-}to\text{-}ohm}$=1.3 μm, $W_{ohm}$=1.6 μm, $W_n$=1.6 μm, and $W_p$=1.6 μm. Accordingly, the curves 302, 304, and 306 of FIG. 15 illustrate the increased channel width ($W_{ch}$) enabled by the SSBC device layout 72A of FIG. 3C (relative to channel width 268 of square cellular device layout 240 of FIG. 12C). For example, in certain embodiments, as illustrated in FIG. 15, the SSBC device layout 72A may enable a channel width that is between approximately 1% and approximately 15% greater that the channel width of the square cellular device layout 240.

Figure 16:
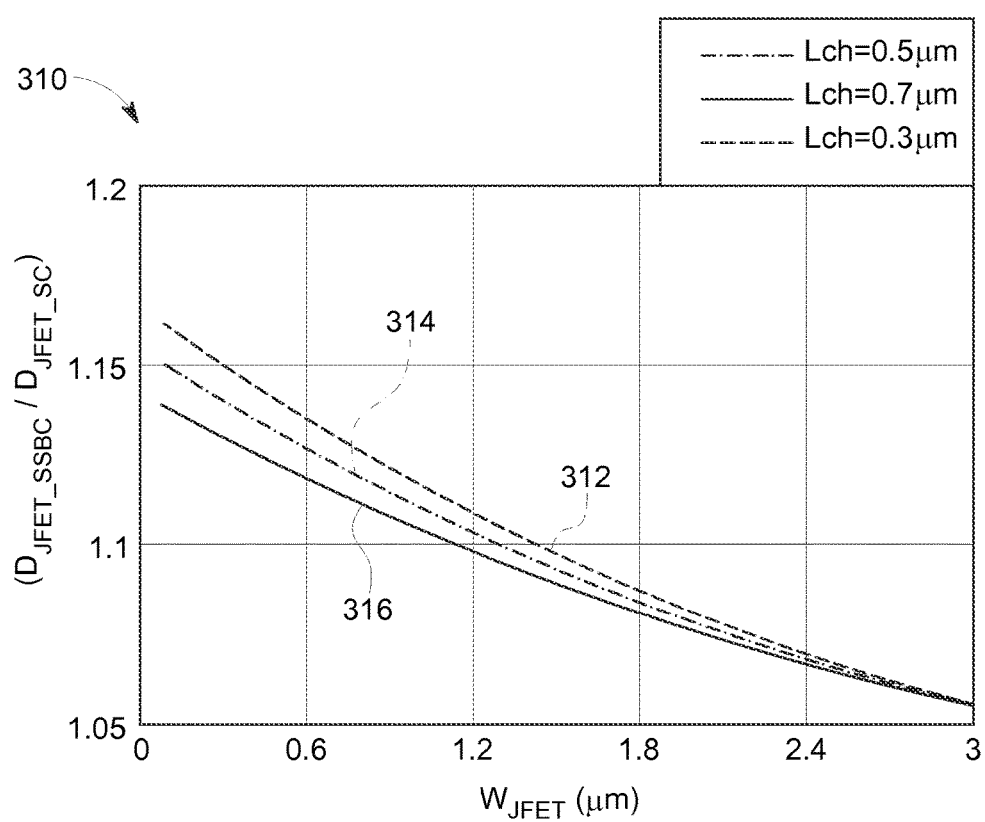
FIG. 16 is a graph illustrating the relationship between normalized JFET density ($D_{JFET}$) (normalized to the JFET density in square cellular device layout of FIG. 12C) and the width of the JFET region ($W_{JFET}$) for SSBC cellular device layout embodiments having different channel lengths ($L_{ch}$).

FIG. 16 is a graph 310 depicting Eq. 7 (i.e., JFET density of SSBC cellular device layout 72A of FIG. 3C normalized to the JFET density of the square cellular layout 240 of FIG. 12C) for devices having three different channel lengths. In particular, the graph 310 illustrated in FIG. 16 includes a curve 312 representing devices having a channel length ($L_{ch}$) of 0.3 μm, a curve 314 representing devices having a channel length ($L_{ch}$) of 0.5 μm, a curve 316 representing devices having a channel length ($L_{ch}$) of 0.7 μm. Further, it may be appreciated that, for the curves 312, 314, and 316: $L_{ch\text{-}to\text{-}ohm}$=1.3 μm, $W_{ohm}$=1.6 μm, $W_n$=1.6 μm, and $W_p$=1.6 μm. Accordingly, the curves 312, 314, and 316 of FIG. 16 illustrate the increased JFET density ($D_{JFET}$) enabled by the SSBC device layout 72A of FIG. 3C relative to the square cell device layout 240 of FIG. 12C. For example, in certain embodiments, as illustrated in FIG. 14, the SSBC device layout 72A may enable a JFET density that is between approximately 1% and approximately 20% greater that the JFET density of the square cell device layout 240.

Technical effects of the invention include cellular device designs and layouts that enable improved semiconductor device performance. In particular, present embodiments reduce device conduction losses (e.g., minimize $R_{ds}$(on)) by providing increased channel width and/or increased channel density to reduce the channel resistance, and by providing increased JFET density to reduce the resistance of the JFET region component. Present embodiments enable these advantages, at least in part, through the use of a segmented source and body contact (SSBC) cellular device layout, in which a body contact region is only partially (i.e., not completely, not on all sides) surrounded by one or more source contact regions. The disclosed SSBC cellular layouts 72A-G enable a reduction of device pitch, and thus, increased channel width per unit area and/or increased JFET region density. Furthermore, the present approach may reduce conduction losses in a number of different device structures (e.g., UMOSFET, VMOSFETs, IGBTs, IBMCTs, or any other suitable device) and/or different semiconductor substrates (e.g., SiC, Si, Ge, AlN, GaN, GaAs, C, or any other suitable semiconductor substrate).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
a rectangular semiconductor device cell disposed at a surface of a silicon carbide (SiC) semiconductor layer, wherein the semiconductor device cell comprises:
a drift region having a first conductivity type;
a well region having a second conductivity type disposed adjacent to the drift region;
a source region having the first conductivity type disposed adjacent to the well region and surrounded by the well region;
a rectangular channel region having the second conductivity type disposed around and adjacent to the source region and proximal to the surface; and
a body contact region having the second conductivity type disposed over a portion of the well region, wherein the body contact region is not centered within a plane of the source region defined by the surface of the semiconductor layer; and
a segmented source and body contact (SSBC) disposed over a portion of the surface, wherein the SSBC comprises:
a body contact portion disposed over the body contact region; and
a source contact portion disposed adjacent to the body contact region and over a portion of the source region, wherein the source contact portion does not completely surround the body contact portion of the SSBC.

2. The system of claim 1, wherein the SSBC has less than two distinct mirror planes of symmetry that are perpendicular to the surface.

3. The system of claim 1, wherein at least one side of the body contact portion of the SSBC is disposed proximate to a portion of the source region not disposed under the SSBC.

4. The system of claim 1, wherein the semiconductor device cell comprises a field transistor, an insulated gate bipolar transistor (IGBT), insulated base MOS-controlled thyristor (IBMCT), a junction field effect transistor (JFET), or a metal-semiconductor field effect transistor (MESFET).

5. A system, comprising:
a rectangular semiconductor device cell disposed at a surface of a silicon carbide (SiC) semiconductor layer, wherein the semiconductor device cell comprises:
a drift region having a first conductivity type;
a well region having a second conductivity type disposed adjacent to the drift region;
a source region having the first conductivity type disposed adjacent to the well region and surrounded by the well region;
a rectangular channel region having the second conductivity type disposed around and adjacent to the source region and proximal to the surface; and
a body contact region having the second conductivity type disposed over a portion of the well region, wherein the body contact region is not centered within a plane of the source region defined by the surface of the semiconductor layer; and
a segmented source and body contact (SSBC) disposed over a portion of the surface, wherein the SSBC comprises:
a body contact portion disposed over the body contact region; and
a source contact portion disposed adjacent to the body contact region and over a portion of the source region, wherein the source contact portion does not completely surround the body contact portion of the SSBC, wherein the SSBC has an elongated rectangular shape, and wherein a first section of the source contact portion is disposed along a first side of the body contact portion.

6. The system of claim 5, wherein a second section of the source contact portion is disposed along a second side of the body contact portion.

7. The system of claim 5, wherein the semiconductor device cell comprises a field transistor, an insulated gate bipolar transistor (IGBT), insulated base MOS-controlled thyristor (IBMCT), a junction field effect transistor (JFET), or a metal-semiconductor field effect transistor (MESFET).

8. A system, comprising:
a semiconductor device cell disposed at a surface of a silicon carbide (SiC) semiconductor layer, wherein the semiconductor device cell comprises:
a drift region having a first conductivity type;
a well region having a second conductivity type disposed adjacent to the drift region;
a source region having the first conductivity type disposed adjacent to the well region and surrounded by the well region;
a channel region having the second conductivity type disposed adjacent to the source region and proximal to the surface; and
a body contact region having the second conductivity type disposed over a portion of the well region, wherein the body contact region is not centered within a plane of the source region defined by the surface of the semiconductor layer; and
a segmented source and body contact (SSBC) disposed over a portion of the surface, wherein the SSBC comprises:
a body contact portion disposed over the body contact region; and
a source contact portion disposed adjacent to the body contact region and over a portion of the source region, wherein the source contact portion does not completely surround the body contact portion of the SSBC, wherein the body contact region is substantially diamond shaped.

9. The system of claim 8, wherein the semiconductor device cell comprises a field transistor, an insulated gate bipolar transistor (IGBT), insulated base MOS-controlled thyristor (IBMCT), a junction field effect transistor (JFET), or a metal-semiconductor field effect transistor (MESFET).

10. A system, comprising:
a semiconductor device cell disposed at a surface of a silicon carbide (SiC) semiconductor layer, wherein the semiconductor device cell comprises:
   a drift region having a first conductivity type;
   a well region having a second conductivity type disposed adjacent to the drift region;
   a source region having the first conductivity type disposed adjacent to the well region and surrounded by the well region;
   a channel region having the second conductivity type disposed around and adjacent to the source region and proximal to the surface; and
   a body contact region having the second conductivity type disposed over a portion of the well region, wherein the body contact region is not centered within a plane of the source region defined by the surface of the semiconductor layer; and
   a segmented source and body contact (SSBC) disposed over a portion of the surface, wherein the SSBC comprises:
      a body contact portion disposed over the body contact region; and
      a source contact portion disposed adjacent to the body contact region and over a portion of the source region, wherein the source contact portion does not completely surround the body contact portion of the SSBC, wherein the body contact region is substantially square shaped.

11. The system of claim 10, wherein the semiconductor device cell comprises a field transistor, an insulated gate bipolar transistor (IGBT), insulated base MOS-controlled thyristor (IBMCT), a junction field effect transistor (JFET), or a metal-semiconductor field effect transistor (MESFET).

12. A system, comprising:
a cellular semiconductor device layout comprising a plurality of semiconductor device cells disposed at a surface of a silicon carbide (SiC) semiconductor layer, wherein the plurality of cellular semiconductor device cells each comprise:
   a drift region having a first conductivity type;
   a well region having a second conductivity type disposed adjacent to the drift region, wherein the well region includes a body contact region disposed proximal to the surface;
   a source region having the first conductivity type that is disposed adjacent to the well region and surrounded by the well region, wherein the source region includes a source contact region disposed proximal to the surface and proximal to the body contact region; and
   an asymmetric segmented source and body contact (SSBC) disposed over a portion of the surface, wherein the asymmetric SSBC has less than two mirror planes of symmetry that are disposed perpendicular to a plane of the surface, and wherein the asymmetric SSBC comprises:
      a body contact portion disposed over the body contact region of the semiconductor device cell; and
      a source contact portion disposed adjacent to the body contact portion and over the source contact region of the semiconductor device cell, wherein the source contact portion of the asymmetric SSBC does not completely surround the body contact portion of the asymmetric SSBC.

13. The system of claim 12, wherein the cellular semiconductor device layout is configured such that $(2\ L_{ch\text{-}to\text{-}ohm}+W_{ohm})$ is greater than $(2\ L_{ch}+W_{JFET})$, or such that that $(2\ L_{ch}+2\ L_{ch\text{-}to\text{-}ohm}+W_{ohm})$ is greater than $W_{JFET}$, or a combination thereof, wherein $L_{ch}$ is a channel length, $L_{ch\text{-}to\text{-}ohm}$ is the length of an ohmic region, $W_{ohm}$ is the width of the ohmic region, and $W_{JFET}$ is the width of a JFET region of the plurality of cellular semiconductor device cells.

14. The system of claim 12, wherein the cellular semiconductor device layout is configured such that $((4\ L_{ch\text{-}to\text{-}ohm}+W_n+W_p+W_{ohm})\cdot(2\ L_{ch}+2\ L_{ch\text{-}to\text{-}ohm}+W_n+W_p+W_{JFET}))$ is greater than $(2\cdot(2\ L_{ch\text{-}to\text{-}ohm}+W_n+W_p)\cdot(2\ L_{ch}+2\ L_{ch\text{-}to\text{-}ohm}+W_{ohm}+W_{JFET})$, or such that $((4\ L_{ch}+4\ L_{ch\text{-}to\text{-}ohm}+W_n+W_p+W_{ohm})\cdot(2\ L_{ch}+2L_{ch\text{-}to\text{-}ohm}+W_n+W_p+W_{JFET}))$ is greater than $(2(2\ L_{ch}+2\ L_{ch\text{-}to\text{-}ohm}+W_n+W_p)\cdot(2\ L_{ch}+2\ L_{ch\text{-}to\text{-}ohm}+W_{ohm}+W_{JFET}))$, or a combination thereof, wherein $L_{ch}$ is channel length, $L_{ch\text{-}to\text{-}ohm}$ is the length of the ohmic region, $W_{ohm}$ is the width of the ohmic region, $W_n$ is the width of the source contact region, $W_p$ is the width of the body contact region, and $W_{JFET}$ is the width of a JFET region of the plurality of cellular semiconductor device cells.

15. The system of claim 14, wherein the cellular semiconductor device layout provides a greater channel width ($W_{ch}$), or a greater JFET density ($D_{JFET}$), or a combination thereof, relative to a different cellular semiconductor device layout having the same $L_{ch}$, $L_{ch\text{-}to\text{-}ohm}$, $W_{ohm}$, $W_n$, $W_p$, and $W_{JFET}$ as the cellular semiconductor device layout, wherein the different cellular semiconductor device layout lacks SSBCs.

16. The system of claim 12, wherein the cellular semiconductor device layout comprises the plurality of the semiconductor device cells arranged in rows, in columns, or both, and wherein the rows or columns are offset from one another.

17. The system of claim 12, wherein each asymmetric SSBC is not aligned with the center of its respective semiconductor device cell.

* * * * *